United States Patent
Chern

(10) Patent No.: US 11,024,626 B2
(45) Date of Patent: Jun. 1, 2021

(54) APPARATUS AND CIRCUITS INCLUDING TRANSISTORS WITH DIFFERENT THRESHOLD VOLTAGES AND METHODS OF FABRICATING THE SAME

(71) Applicant: Taiwan Semiconductor Manufacturing Co., Ltd., Hsinchu (TW)

(72) Inventor: Chan-Hong Chern, Palo Alto, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/576,525

(22) Filed: Sep. 19, 2019

(65) Prior Publication Data

US 2020/0135722 A1    Apr. 30, 2020

Related U.S. Application Data

(60) Provisional application No. 62/753,618, filed on Oct. 31, 2018.

(51) Int. Cl.
| | | |
|---|---|---|
| H01L 27/088 | (2006.01) | |
| H01L 29/778 | (2006.01) | |
| H03K 17/687 | (2006.01) | |
| H01L 21/8252 | (2006.01) | |
| H01L 29/43 | (2006.01) | |
| H01L 29/66 | (2006.01) | |

(52) U.S. Cl.
CPC ...... *H01L 27/0883* (2013.01); *H01L 21/8252* (2013.01); *H01L 29/432* (2013.01); *H01L 29/66462* (2013.01); *H01L 29/7786* (2013.01); *H03K 17/6871* (2013.01)

(58) Field of Classification Search
CPC .......... H01L 29/66462; H01L 29/7787; H01L 29/2003; H01L 29/205; H01L 2924/13064; H01L 29/66431; H01L 29/778–7789; H01L 29/122–127; H01L 29/15–158
See application file for complete search history.

(56) References Cited

U.S. PATENT DOCUMENTS

| | | | | |
|---|---|---|---|---|
| 9,793,389 | B1* | 10/2017 | Chern | H01L 29/2003 |
| 2014/0077217 | A1* | 3/2014 | Saito | H01L 21/743 |
| | | | | 257/76 |
| 2019/0140637 | A1* | 5/2019 | Chen | H03K 17/04123 |
| 2019/0326425 | A1* | 10/2019 | Bayruns | H01L 29/66431 |

\* cited by examiner

*Primary Examiner* — Jonathan Han
(74) *Attorney, Agent, or Firm* — Duane Morris LLP

(57) ABSTRACT

Apparatus and circuits including transistors with different threshold voltages and methods of fabricating the same are disclosed. In one example, a semiconductor structure is disclosed. The semiconductor structure includes: a substrate; an active layer that is formed over the substrate and comprises a plurality of active portions; a polarization modulation layer comprising a plurality of polarization modulation portions each of which is disposed on a corresponding one of the plurality of active portions; and a plurality of transistors each of which comprises a source region, a drain region, and a gate structure formed on a corresponding one of the plurality of polarization modulation portions. The transistors have at least three different threshold voltages.

20 Claims, 22 Drawing Sheets

APPARATUS AND CIRCUITS INCLUDING TRANSISTORS WITH DIFFERENT THRESHOLD VOLTAGES AND METHODS OF FABRICATING THE SAME

RELATED APPLICATION

This application claims priority to U.S. Provisional Patent Application No. 62/753,618, entitled "TRANSISTORS HAVING MULTIPLE THRESHOLD VOLTAGES AND METHODS OF FABRICATING THE SAME," and filed on Oct. 31, 2018, the entirety of which is incorporated by reference herein.

BACKGROUND

In an integrated circuit (IC), an enhancement-mode N-type transistor, e.g. enhancement-mode high-electron-mobility transistor (E-HEMT), may be used as a pull-up device to minimize static current. In order to achieve near full-rail pull-up voltage and fast slew rate, a significantly large over-drive voltage is needed for an N-Type enhancement-mode transistor. That is, the voltage difference between gate and source (Vgs) should be much larger than the threshold voltage (Vt), i.e. (Vgs−Vt>>0). It is imperative to use a multi-stage E-HEMT based driver for integrated circuit to minimize static current. Nevertheless, multi-stage E-HEMT based drivers will not have enough over-drive voltage (especially for the last-stage driver) due to one Vt drop across each stage of E-HEMT pull-up device and one forward voltage (Vf) drop across boot-strap diode. Although one can reduce the Vt for the pull-up E-HEMT transistors and Vf of diode-connected E-HEMT rectifier of multi-stage drivers to provide significantly enough over-drive voltage and dramatically reduce static current, the noise immunity will be compromised.

In an existing semiconductor wafer, transistors formed on the wafer have identical structure such that they have a same threshold voltage Vt. When Vt of one transistor is reduced, Vt's of other transistors on the wafer are reduced accordingly. As Vt being reduced in this case, a power switch HEMT driven by the HEMT-based driver will have a poor noise immunity because the power switch HEMT cannot withstand a large back-feed-through impulse voltage to its gate. Thus, existing apparatus and circuits including multiple transistors are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

FIGS. 3A, 3B, 3C, 3D, 3E, 3F, 3G, 3H, 3I, 3J, 3K, 3L, 3M, 3N, 3O, 3P and 3Q illustrate cross-sectional views of an exemplary semiconductor device during various fabrication stages, in accordance with some embodiments of the present disclosure.

DETAILED DESCRIPTION OF EXEMPLARY EMBODIMENTS

Figure 1:
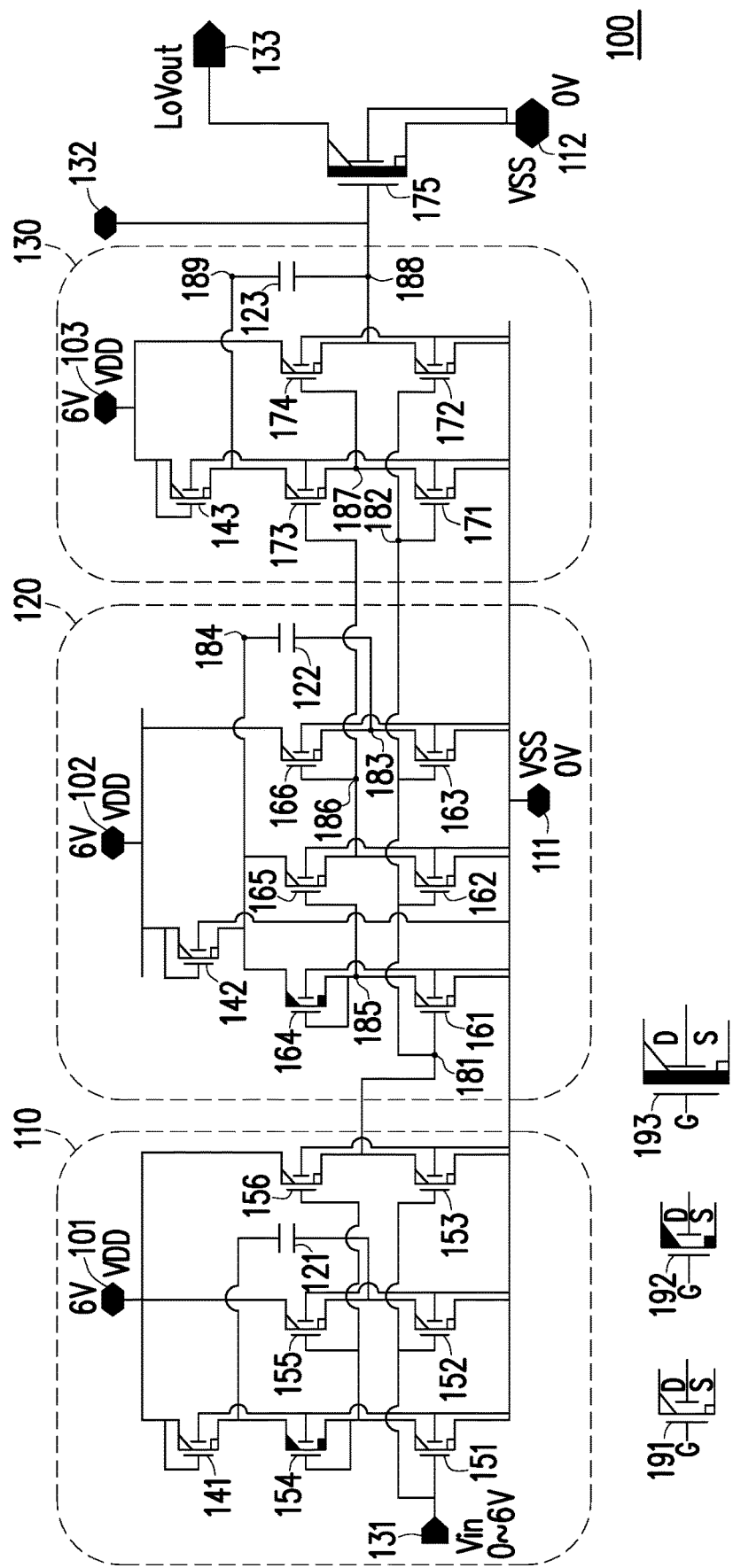
FIG. 1 illustrates an exemplary circuit having a multi-stage boot-strapped driver, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

An enhancement-mode high-electron-mobility transistor (HEMT), e.g. a gallium nitride (GaN) HEMT, has superior characteristics to enable high performance and smaller form factor in power conversion and radio frequency power amplifier and power switch applications compared to silicon based transistors. But there is no viable p-type HEMT available mostly due to much lower p-type mobility and partly due to two dimensional hole gas (2DHG) band structure. While n-type GaN HEMTs are used in an integrated circuit, to minimize static current, the pull-up devices are mostly based on enhancement-mode n-type transistors rather than depletion-mode n-type transistors.

A multi-stage HEMT based driver can be used for an integrated circuit to minimize static current. But multi-stage HEMT based drivers will not have enough over-drive voltage (especially for the last-stage driver) due to one threshold voltage (Vt) drop across each stage of HEMT pull-up device and one forward voltage (Vf) drop across boot-strap diode. Although one can reduce the Vt for the pull-up HEMT transistors and Vf of diode-connected HEMT rectifier of multi-stage drivers to provide significantly enough over-drive voltage and dramatically reduce static current, the noise immunity will be compromised.

Instead of reducing a single value of the threshold voltage (Vt) of the HEMT transistors in an IC, the present teaching discloses apparatus and circuits including multiple Vt transistors and their fabrication process. In one embodiment, a plurality of transistors formed on a same wafer have different Vt's. The wafer has an active layer comprising a plurality of active portions, and a polarization modulation layer comprising a plurality of polarization modulation portions each of which is disposed on a corresponding one of the plurality of active portions. Each of the plurality of transistors includes a source region, a drain region, and a gate structure formed on a corresponding one of the plurality of polarization modulation portions. The transistors have at least three different threshold voltages.

The different threshold voltages among the plurality of transistors are achieved by manners selected from the following: different gate materials (e.g. tungsten, nickel), different p-type doping materials (e.g. magnesium, beryllium) in corresponding polarization modulation portions, different thicknesses of corresponding active portions, different material compositions (e.g. aluminum compositions) of corresponding active portions, and different material structures (e.g. homogeneous or graded) of corresponding active portions. While a lower work-function gate material, e.g. tungsten (W) or titanium/tungsten/titanium-nitride (Ti/W/TiN) metal stack, can be used for implementing a high-Vt HEMT; a higher work-function gate material, e.g. nickel (Ni) or titanium/nickel/titanium-nitride (Ti/Ni/TiN) metal stack, can be used for implementing a low-Vt HEMT. GaN transistors having different Vt's can be implemented by depositing different gate materials.

The active layers may be aluminum gallium nitride (AlGaN) layers on a same GaN layer, which is a channel layer for the transistors. Different thicknesses of the AlGaN layers can change the amount of spontaneous polarization and piezoelectric polarization between the AlGaN layer and the GaN layer. A thicker AlGaN layer introduces higher polarizations and hence creates more amount of two dimensional electric gas (2-DEG) to lower the Vt. In addition, different material compositions of the AlGaN layers can also change the polarization amount between the AlGaN layer and the GaN layer. A higher Al composition introduces higher polarizations and hence creates more amount of 2-DEG to lower the Vt. Further, different material structures of the AlGaN layers can also change the polarization amount between the AlGaN layer and the GaN layer. For example, one transistor's active AlGaN layer has a graded structure that includes a plurality of sub-layers each of which comprises AlGaN with a different Al proportion, while the other transistor's active AlGaN layer has a homogeneous structure that comprises AlGaN with a single constant Al proportion.

The graded AlGaN has less polarizations, introduces less amount of 2-DEG, and hence increases the Vt. Hence, GaN transistors having different Vt's can be implemented by depositing AlGaN layers with different Al compositions, different thicknesses, and/or different material structures.

In addition, different p-type doping materials of the polarization modulation portions (i.e. GaN gate stacks) may be chosen to obtain different Vt transistors correspondingly. Several column I and column II elements, e.g. magnesium (Mg), lithium (Li), sodium (Na), beryllium (Be), calcium (Ca), can be chosen as doping materials for the p-typed doped GaN (pGaN) gate stacks for the GaN based transistors. Different p-type doping materials will induce different work functions of the pGaN gate to achieve different-Vt GaN devices. For instance, a Mg-doped pGaN gate stack will induce a higher Vt than a Be-doped pGaN gate stack.

In one embodiment, the plurality of transistors includes three transistors having three different Vt's respectively. Among the three transistors, the first transistor and the second transistor are different in terms of a first manner selected from the above manners; the second transistor and the third transistor are different in terms of a second manner selected from the above manners. The first manner is different from the second manner. For example, the first transistor and the second transistor have different gate materials, while the second transistor and the third transistor have different p-type doping materials in the corresponding polarization modulation portions.

The disclosed apparatus can adjust the work function difference between the gate electro and the AlGaN layer, and the polarization amount between the AlGaN layer and the GaN layer to create multiple-Vt (or various-Vt) transistors on a same semiconductor wafer; and generate different amount of 2-DEG for transistors at different locations of the same wafer. The present disclosure is applicable to any transistor based IC. The proposed apparatus and methods can enable a transistor based IC to reduce the static current significantly and have significantly large over-drive voltages for drivers of concern; without compromising noise immunity while increasing over-drive voltages and reducing static currents. In addition, the disclosed apparatus and methods can provide IC designers the flexibility of using different Vt devices for specific functions of improving performance, reducing static current, improving noise immunity, etc.

FIG. 1 illustrates an exemplary circuit 100 having a multi-stage boot-strapped driver, in accordance with some embodiments of the present disclosure. As shown in FIG. 1, the circuit 100 includes a driver having multiple stages 110, 120, 130 serially connected to drive a power switch HEMT 175. Each stage includes multiple transistors.

The stage 110 in this example includes transistors 141, 151, 152, 153, 154, 155, 156. In one embodiment, among these transistors, the transistor 154 is a low voltage depletion-mode high electron mobility transistor (LV D-HEMT) 192; while each of the other transistors 141, 151, 152, 153, 155, 156 is a low voltage enhancement-mode high electron mobility transistor (LV E-HEMT) 191.

As shown in FIG. 1, the gate of the transistor 151 is electrically connected to an input pin 131 of the circuit 100. The input pin 131 has an input voltage Vin ranged from a low logic state voltage (e.g. 0 V) to a high logic state voltage (e.g. 6V). When the circuit 100 is turned off, the Vin is 0. The circuit 100 is turned on after the Vin is increased to 6V. The transistor 151 has a source electrically connected to ground Vss 111 which has a ground voltage 0V; and has a drain electrically connected to a source of the transistor 154. The transistor 152 in this example has a gate electrically connected to the input pin 131, a source electrically connected to the ground Vss 111 which has a ground voltage 0V, and a drain electrically connected to a source of the transistor 155. Similarly, the transistor 153 in this example has a gate electrically connected to the input pin 131, a source electrically connected to the ground Vss 111 which has a ground voltage 0V, and a drain electrically connected to a source of the transistor 156.

The transistor 154 in this example has a gate electrically connected to its own source, which is electrically connected to the drain of the transistor 151. Drain of the transistor 154 is electrically connected to a source of the transistor 141. The transistor 155 in this example has a gate electrically connected to the source of the transistor 154 and electrically connected to the drain of the transistor 151. The transistor 155 has a source electrically connected to the drain of the transistor 152, and a drain electrically connected to a power supply pin VDD 101 which has a positive power supply voltage (e.g. 6V). Similarly, the transistor 156 in this example has a gate electrically connected to the source of the transistor 154 and electrically connected to the drain of the transistor 151, a source electrically connected to the drain of the transistor 153, and a drain electrically connected to the power supply pin VDD 101 which has a positive power supply voltage 6V.

The transistor 141 in this example has a gate electrically connected to its own drain, which is electrically connected to the power supply pin VDD 101 which has a positive power supply voltage 6V. The transistor 141 connected in this specific configuration is functioning like a rectifier or diode and is conventionally called as a diode-connected transistor. Source of the transistor 141 is electrically connected to the drain of the transistor 154. The stage 110 further includes a capacitor 121 coupled between the source of the transistor 141 and the source of the transistor 155.

The stage 120 in this example includes transistors 142, 161, 162, 163, 164, 165, 166. In one embodiment, among these transistors, the transistor 164 is a low voltage depletion-mode high electron mobility transistor (LV D-HEMT) 192; while each of the other transistors 142, 161, 162, 163, 165, 166 is a low voltage enhancement-mode high electron mobility transistor (LV E-HEMT) 191.

As shown in FIG. 1, the gate of the transistor 161 is electrically connected to a node 181, which is electrically connected to the source of the transistor 156 and the drain of the transistor 153. The node 181 has a voltage ranged between Vss and VDD (0 and 6V). When the circuit 100 is turned off, the Vin is 0, such that the transistor 153 is turned off and the transistor 156 is turned on. The node 181 has the same voltage 6V as the power supply pin VDD 101. When the circuit 100 is turned on and the Vin has a voltage of 6V, the transistor 153 is turned on and the transistor 156 is turned off. The node 181 has the same voltage 0V as the ground Vss 111.

The transistor 161 has a source electrically connected to ground Vss 111 which has a ground voltage 0V; and has a drain electrically connected to a source of the transistor 164. The transistor 162 in this example has a gate electrically connected to the node 181, a source electrically connected to the ground Vss 111 which has a ground voltage 0V, and a drain electrically connected to a source of the transistor 165. Similarly, the transistor 163 in this example has a gate electrically connected to the node 181, a source electrically connected to the ground Vss 111 which has a ground voltage 0V, and a drain electrically connected to a source of the transistor 166.

The transistor 164 in this example has a gate electrically connected to its own source, which is electrically connected to the drain of the transistor 161. Drain of the transistor 164 is electrically connected to a source of the transistor 142. The transistor 165 in this example has a gate electrically connected to a node 185, which is electrically connected to the source of the transistor 164 and electrically connected to the drain of the transistor 161. The transistor 165 has a source electrically connected to the drain of the transistor 162, and a drain electrically connected to the source of the transistor 142. The transistor 166 in this example has a gate electrically connected to a node 186, which is electrically connected to the source of the transistor 165 and electrically connected to the drain of the transistor 162, a source electrically connected to the drain of the transistor 163, and a drain electrically connected to a power supply pin VDD 102 which has a positive power supply voltage (e.g. 6V).

The transistor 142 in this example has a gate electrically connected to its own drain (i.e. diode-connected to act like a rectifier or a diode), which is electrically connected to the power supply pin VDD 102 which has a positive power supply voltage 6V. Source of the transistor 142 is electrically connected to the drain of the transistor 164 and the drain of the transistor 165. The stage 120 further includes a capacitor 122 coupled between a node 184 electrically connected to the source of the transistor 142 and a node 183 electrically connected to the source of the transistor 166.

The stage 130 in this example includes transistors 143, 171, 172, 173, 174. In one embodiment, each of these transistors is a low voltage enhancement-mode high electron mobility transistor (LV E-HEMT) 191. As shown in FIG. 1, the gate of the transistor 171 is electrically connected to a node 182, which is electrically connected to the node 181, the source of the transistor 156 and the drain of the transistor 153. Same as the node 181, the node 182 has a voltage ranged between Vss and VDD (0 and 6V). When the circuit 100 is turned off, the Vin is 0, such that the transistor 153 is turned off and the transistor 156 is turned on. The node 181 and the node 182 have the same voltage 6V as the power supply pin VDD 101. When the circuit 100 is turned on and the Vin has a voltage of 6V, the transistor 153 is turned on and the transistor 156 is turned off. The node 181 and the node 182 have the same voltage 0V as the ground Vss 111.

The transistor 171 has a source electrically connected to ground Vss 111 which has a ground voltage 0V; and has a drain electrically connected to a source of the transistor 173. The transistor 172 in this example has a gate electrically connected to the node 182, a source electrically connected to the ground Vss 111 which has a ground voltage 0V, and a drain electrically connected to a source of the transistor 174.

The transistor 173 in this example has a gate electrically connected to the node 186, which is electrically connected to the source of the transistor 165. The transistor 173 has a source electrically connected to the drain of the transistor 171, and a drain electrically connected to a source of the transistor 143. The transistor 174 in this example has a gate electrically connected to a node 187, which is electrically connected to the source of the transistor 173 and electrically connected to the drain of the transistor 171. The transistor 174 has a source electrically connected to the drain of the transistor 172, and a drain electrically connected to a power supply pin VDD 103 which has a positive power supply voltage 6V.

The transistor 143 in this example has a gate electrically connected to its own drain (i.e. diode-connected to act like a rectifier or diode), which is electrically connected to the power supply pin VDD 103 which has a positive power supply voltage 6V. Source of the transistor 143 is electrically connected to the drain of the transistor 173. The stage 130 further includes a capacitor 123 coupled between a node 189 electrically connected to the source of the transistor 143 and a node 188 electrically connected to the source of the transistor 174.

As such, the stages 110, 120, 130 are serially connected to form a multi-stage driver that drives a power switch transistor 175. In one embodiment, the power switch HEMT 175 is a high voltage enhancement-mode high electron mobility transistor (HV E-HEMT) 193. As shown in FIG. 1, the power switch HEMT 175 has a gate electrically connected to the node 188, a source electrically connected to ground Vss 112 which has a ground voltage 0V, and a drain electrically connected to an output pin 133 of the circuit 100. In some embodiments, the circuit 100 can serve as a low-side driver in a half-bridge or full-bridge power converter, where the output pin 133 serves as a low-side voltage output (LoVout).

Most transistors in FIG. 1 are enhancement-mode N-type transistors. That is, the circuit 100 uses mostly enhancement-mode N-type transistors as pull-up devices to minimize static current. In order to achieve near full-rail pull-up voltage and fast slew rate, a significantly large over-drive voltage is needed for the N-Type enhancement-mode transistor. That is, the voltage difference between gate and source (Vgs) should be much larger than the threshold voltage (Vt), i.e. (Vgs−Vt>>0). While the multi-stage driver of the circuit 100 can minimize static current, each stage of E-HEMT pull-up device consumes at least one Vt voltage drop.

As discussed above, the node 181 has a voltage ranged between Vss and VDD (0 and 6V). When the circuit 100 is turned off, the Vin is 0, such that the transistor 153 is turned off and the transistor 156 is turned on. The node 181 has the same voltage 6V as the power supply pin VDD 101, which enables the transistors 161, 162, 163 to be turned on. As such, the node 185 is electrically connected to the ground Vss 111, and has a voltage close to 0V. As such, the transistor 165 is turned off, and the node 186 is electrically connected to the ground Vss 111 and has a voltage 0V. Accordingly, the transistor 166 is turned off, and the node 183 is electrically connected to the ground Vss 111 and has a voltage 0V. In this case, the capacitor 122 is charged by the power supply pin VDD 102 via the transistor 142. In this example, the transistor 142 is a diode-connected HEMT used as a rectifying diode, which naturally has a forward voltage (Vf). That is, the voltage at the node 184 will maximally be charged to 6V−Vf. In a first example, assuming the forward voltages and threshold voltages of all transistors in FIG. 1 are equal to 1.5V, the maximum voltage at the node 184 when the circuit 100 is turned off is 6V−1.5V=4.5V.

When the circuit 100 is turned on and the Vin has a voltage of 6V, the transistor 153 is turned on and the transistor 156 is turned off. The node 181 has the same voltage 0V as the ground Vss 111, which enables the transistors 161, 162, 163 to be turned off. As such, the node 185 is electrically connected to the node 184, and has a same voltage as the node 184. This induces the transistor 165 to be turned on, which enables the node 186 to be charged by the voltage at the node 184. This in turn induces the transistor 166 to be turned on, which enables the node 183 to be charged by the power supply pin VDD 102. As such, the voltage at the node 183 can maximally be charged to 6V, same as the voltage of the power supply pin VDD 102. Based on the 4.5V voltage difference stored by the capacitor 122 when the circuit 100 is off, the voltage at the node 184 can maximally be charged and increased to 6V+4.5V=10.5V, i.e. the voltage at the node 184 is boot-strapped to 10.5V. Accordingly, the node 185, which is electrically connected to both the source and the gate of the transistor 164, is charged to 10.5V as well.

While the node 186 is also charged by the voltage 10.5V at the node 184, the voltage of the node 186 cannot reach 10.5V. Because the node 186 is electrically connected to the source of the transistor 165, to keep the transistor 165 on, the gate source voltage difference Vgs of the transistor 165 must be larger than the threshold voltage (Vt) of the transistor 165. As it is assumed Vt=1.5V in the first example, the maximum voltage the node 186 can reach in the first example when the circuit 100 is turned on is 10.5V−Vt=10.5V−1.5V=9V. As such, an enhancement-mode high-electron-mobility transistor (E-HEMT) pull-up device consumes at least one Vt voltage drop.

The node 182 is electrically connected to the node 181 and has a same voltage as that of the node 181. That is, when the circuit 100 is turned off, the node 182 has the voltage 6V; when the circuit 100 is turned on, the node 182 has the voltage 0V. When the circuit 100 is turned off, the 6V voltage at the node 182 enables the transistors 171, 172 to be turned on. As such, the node 187 is electrically connected to the ground Vss 111, and has a voltage 0V. Here, the transistor 173 is turned off due to the 0V voltage at the node 186 when the circuit 100 is turned off as discussed above. Because the node 187 has the voltage 0V, the transistor 174 is turned off, and the node 188 is electrically connected to the ground Vss 111 and has a voltage 0V. In this case, the capacitor 123 is charged by the power supply pin VDD 103 via the transistor 143. In this example, the transistor 143 is a diode-connected HEMT used as a rectifying diode, which naturally has a forward voltage (Vf). That is, the voltage at the node 189 will maximally be charged to 6V−Vf. In the first example, assuming the forward voltages and threshold voltages of all transistors in FIG. 1 are equal to 1.5V, the maximum voltage at the node 189 when the circuit 100 is turned off is 6V−1.5V=4.5V.

When the circuit 100 is turned on, the node 182, like the node 181, has the same voltage 0V as the ground Vss 111, which enables the transistors 171, 172 to be turned off. As discussed above, the node 186, which is electrically connected to the gate of the transistor 173, has a maximum voltage of 9V when the circuit 100 is turned on. As such, the transistor 173 is turned on and the node 187 is charged by the node 189. This induces the transistor 174 to be turned on, which enables the node 188 to be charged by the power supply pin VDD 103. As such, the voltage at the node 188 can maximally be charged to 6V, same as the voltage of the power supply pin VDD 102. Based on the 4.5V voltage difference stored by the capacitor 123 when the circuit 100 is off, the voltage at the node 189 can maximally be charged and increased to 6V+4.5V=10.5V, i.e. the voltage at the node 189 is boot-strapped to 10.5V.

While the node 187 is charged by the voltage 10.5V at the node 189, the voltage of the node 187 cannot reach 10.5V. Because the node 187 is electrically connected to the source of the transistor 173, to keep the transistor 173 on, the gate source voltage difference Vgs of the transistor 173 must be larger than the threshold voltage (Vt) of the transistor 173. The gate of the transistor 173 is electrically connected to the node 186, which has a maximum voltage 9V when the circuit 100 is turned on. As it is assumed Vt=1.5V in the first example, the maximum voltage the node 187 can reach in the first example when the circuit 100 is turned on is 9V−Vt=9V−1.5V=7.5V. Now the transistor 174 has a gate source voltage difference Vgs=7.5V−6V=1.5V, which is exactly equal to the threshold voltage Vt=1.5V of the transistor 174. This leaves no voltage margin at the last stage of the multi-stage boot-strapped driver. That is, in the first example where Vf=Vt=1.5V, there is not enough over-drive voltage to drive the power switch HEMT 175. Even if the power switch HEMT 175 can be driven, it would be significantly slow as the current flowing through the transistor 174 and the node 188 would be very slow due to no Vgs margin compared to the Vt. The above conclusion has not even taken into consideration of the Vt variation (e.g. 3-σ variation of 0.5V), which typically exists in all process technologies. After counting the 3-σ variation of 0.5V, the circuit 100, under the Vt=1.5V assumption, may not be able to drive the power switch HEMT 175 at all.

In a second example, it is assumed the forward voltages and threshold voltages of all transistors in FIG. 1 are equal to 1V. In this case, when the circuit 100 is turned off, the node 181 has the same voltage 6V, which enables the transistors 161, 162, 163 to be turned on. As such, the node 185 is electrically connected to the ground Vss 111 and has a voltage 0V. As such, the transistor 165 is turned off, and the node 186 is electrically connected to the ground Vss 111 and has a voltage 0V. Accordingly, the transistor 166 is turned off, and the node 183 is electrically connected to the ground Vss 111 and has a voltage 0V. The capacitor 122 is charged by the power supply pin VDD 102 via the transistor 142. Because the transistor 142 is a diode-connected HEMT used as a rectifying diode which naturally has a forward voltage (Vf), the node 184 can have a maximum voltage of 6V−Vf=6V−1V=5V.

When the circuit 100 is turned on, the node 181 has the same voltage 0V as the ground Vss 111, which enables the transistors 161, 162, 163 to be turned off. As such, the node 185 is electrically connected to the node 184, and has a same voltage as the node 184. This induces the transistor 165 to be turned on, which enables the node 186 to be charged by the voltage at the node 184. This in turn induces the transistor 166 to be turned on, which enables the node 183 to be charged by the power supply pin VDD 102. As such, the node 183 has a maximum voltage of 6V, same as the voltage of the power supply pin VDD 102. Based on the 5V voltage difference stored by the capacitor 122 when the circuit 100 is off, the voltage at the node 184 can maximally be charged and increased to 6V+5V=11V, i.e. the voltage at the node 184 is boot-strapped to 11V. Accordingly, the node 185, which is electrically connected to both the source and the gate of the transistor 164, is charged to 11V as well. While the node 186 is also charged by the voltage 11V at the node 184, the voltage of the node 186 cannot reach 11V. Because the node 186 is electrically connected to the source of the transistor 165, to keep the transistor 165 on, the gate source voltage difference Vgs of the transistor 165 must be larger than the threshold voltage (Vt) of the transistor 165. As it is assumed Vt=1V in the second example, the maximum voltage the node 186 can reach in the second example when the circuit 100 is turned on is 11V−Vt=11V−1V=10V.

The node 182 is electrically connected to the node 181 and has a same voltage as that of the node 181. That is, when the circuit 100 is turned off, the node 182 has the voltage 6V; when the circuit 100 is turned on, the node 182 has the voltage 0V. When the circuit 100 is turned off, the 6V voltage at the node 182 enables the transistors 171, 172 to be turned on. As such, the node 187 is electrically connected to the ground Vss 111, and has a voltage 0V. Here, the transistor 173 is turned off due to the 0V voltage at the node 186 when the circuit 100 is turned off as discussed above.

Because the node 187 has the voltage 0V, the transistor 174 is turned off, and the node 188 is electrically connected to the ground Vss 111 and has a voltage 0V. In this case, the capacitor 123 is charged by the power supply pin VDD 103 via the transistor 143. Because the transistor 143 is a diode-connected HEMT used as a rectifying diode which naturally has a forward voltage (Vf), the node 189 has a maximum voltage of 6V−Vf=6V−1V=5V.

When the circuit 100 is turned on, the node 182, like the node 181, has the same voltage 0V as the ground Vss 111, which enables the transistors 171, 172 to be turned off. As discussed above, the node 186, which is electrically connected to the gate of the transistor 173, has a maximum voltage of 10V when the circuit 100 is turned on. As such, the transistor 173 is turned on and the node 187 is charged by the node 189. This induces the transistor 174 to be turned on, which enables the node 188 to be charged by the power supply pin VDD 103. As such, the voltage at the node 188 can maximally be charged to 6V, same as the voltage of the power supply pin VDD 103. Based on the 5V voltage difference stored by the capacitor 123 when the circuit 100 is off, the voltage at the node 189 can maximally be charged and increased to 6V+5V=11V, i.e. the voltage at the node 189 is boot-strapped to 11V.

While the node 187 is charged by the voltage 11V at the node 189, the voltage of the node 187 cannot reach 11V. Because the node 187 is electrically connected to the source of the transistor 173, to keep the transistor 173 on, the gate source voltage difference Vgs of the transistor 173 must be larger than the threshold voltage (Vt) of the transistor 173. The gate of the transistor 173 is electrically connected to the node 186, which has a maximum voltage 10V when the circuit 100 is turned on. As it is assumed Vt=1V in the second example, the maximum voltage the node 187 can reach in the second example when the circuit 100 is turned on is 10V−Vt=10V−1V=9V. Now the transistor 174 has a gate source voltage difference Vgs=9V−6V=3V, which is much larger than the threshold voltage Vt=1V of the transistor 174. This leaves enough voltage margin at the last stage of the multi-stage boot-strapped driver. That is, in the second example where Vf=Vt=1V, there is enough over-drive voltage to drive the power switch HEMT 175. However, since all transistors, including the power switch HEMT 175, in FIG. 1 are using a same Vt, a reduced Vt at the power switch HEMT 175 may cause the noise immunity of the output power switch 175 become significantly worse due to not being able to withstand a large back-feed-through impulse (di/dt) voltage to the gate of the output power switch 175. Because there is inevitable parasitic capacitance between the drain and the gate of the power switch HEMT 175, a voltage impulse will feed back from the drain of the power switch HEMT 175 to the gate of the power switch HEMT 175 through the parasitic capacitance. This could accidently turn on the power switch HEMT 175 so long as the noise voltage is larger than the reduced Vt of the power switch HEMT 175, even when the circuit 100 is turned off.

As such, in a third example, the forward voltages and threshold voltages of all transistors in FIG. 1 are not all the same. In the third example, it is assumed that the transistors 142, 143, 174 have an ultra-low Vt of 0.5V, the transistors 165, 173 have a low Vt of 1V, while the other transistors in FIG. 1 have a high Vt of 1.5V. In this case, when the circuit 100 is turned off, the node 181 has the same voltage 6V, which enables the transistors 161, 162, 163 to be turned on. As such, the node 185 is electrically connected to the ground Vss 111 and has a voltage 0V. As such, the transistor 165 is turned off, and the node 186 is electrically connected to the ground Vss 111 and has a voltage 0V. Accordingly, the transistor 166 is turned off, and the node 183 is electrically connected to the ground Vss 111 and has a voltage 0V. The capacitor 122 is charged by the power supply pin VDD 102 via the transistor 142. Because the transistor 142 has a forward voltage Vf equal to its Vt, the node 184 can have a maximum voltage of 6V−Vf=6V−0.5V=5.5V.

When the circuit 100 is turned on, the node 181 has the same voltage 0V as the ground Vss 111, which enables the transistors 161, 162, 163 to be turned off. As such, the node 185 is electrically connected to the node 184, and has a same voltage as the node 184. This induces the transistor 165 to be turned on, which enables the node 186 to be charged by the voltage at the node 184. This in turn induces the transistor 166 to be turned on, which enables the node 183 to be charged by the power supply pin VDD 102. As such, the node 183 has a maximum voltage of 6V, same as the voltage of the power supply pin VDD 102. Based on the 5.5V voltage difference stored by the capacitor 122 when the circuit 100 is off, the voltage at the node 184 can maximally be charged and increased to 6V+5.5V=11.5V, i.e. the voltage at the node 184 is boot-strapped to 11.5V. Accordingly, the node 185, which is electrically connected to both the source and the gate of the transistor 164, is charged to 11.5V as well. While the node 186 is also charged by the voltage 11.5V at the node 184, the voltage of the node 186 cannot reach 11.5V. Because the node 186 is electrically connected to the source of the transistor 165, to keep the transistor 165 on, the gate source voltage difference Vgs of the transistor 165 must be larger than the Vt=1V of the transistor 165. So the maximum voltage the node 186 can reach in the third example when the circuit 100 is turned on is 11.5V−1V=10.5V.

The node 182 is electrically connected to the node 181 and has a same voltage as that of the node 181. That is, when the circuit 100 is turned off, the node 182 has the voltage 6V; when the circuit 100 is turned on, the node 182 has the voltage 0V. When the circuit 100 is turned off, the 6V voltage at the node 182 enables the transistors 171, 172 to be turned on. As such, the node 187 is electrically connected to the ground Vss 111, and has a voltage 0V. Here, the transistor 173 is turned off due to the 0V voltage at the node 186 when the circuit 100 is turned off as discussed above. Because the node 187 has the voltage 0V, the transistor 174 is turned off, and the node 188 is electrically connected to the ground Vss 111 and has a voltage 0V. In this case, the capacitor 123 is charged by the power supply pin VDD 103 via the diode-connected transistor 143. Because the diode-connected transistor 143 has a forward voltage Vf equal to its Vt, the node 189 has a maximum voltage of 6V−Vf=6V−0.5V=5.5V.

When the circuit 100 is turned on, the node 182, like the node 181, has the same voltage 0V as the ground Vss 111, which enables the transistors 171, 172 to be turned off. As discussed above, the node 186, which is electrically connected to the gate of the transistor 173, has a maximum voltage of 10.5V when the circuit 100 is turned on. As such, the transistor 173 is turned on and the node 187 is charged by the node 189. This induces the transistor 174 to be turned on, which enables the node 188 to be charged by the power supply pin VDD 103. As such, the voltage at the node 188 can maximally be charged to 6V, same as the voltage of the power supply pin VDD 102. Based on the 5.5V voltage difference stored by the capacitor 123 when the circuit 100 is off, the voltage at the node 189 can maximally be charged and increased to 6V+5.5V=11.5V, i.e. the voltage at the node 189 is boot-strapped to 11.5V.

While the node 187 is charged by the voltage 11.5V at the node 189, the voltage of the node 187 cannot reach 11.5V. Because the node 187 is electrically connected to the source of the transistor 173, to keep the transistor 173 on, the gate source voltage difference Vgs of the transistor 173 must be larger than the threshold voltage Vt=1V of the transistor 173. Because the gate of the transistor 173 is electrically connected to the node 186, which has a maximum voltage 10.5V when the circuit 100 is turned on, the maximum voltage the node 187 can reach in the third example when the circuit 100 is turned on is 10.5V−Vt=10.5V−1V=9.5V. Now the transistor 174 has a gate source voltage difference Vgs=9.5V−6V=3.5V, which is much larger than the threshold voltage Vt=0.5V of the transistor 174. This leaves enough voltage margin at the last stage of the multi-stage boot-strapped driver. That is, in the third example, there is enough over-drive voltage to drive the power switch HEMT 175. In addition, since the power switch HEMT 175 has a larger Vt=1.5V, the noise immunity of the output power switch 175 will be better than the second example, because a larger Vt of the power switch HEMT 175 can significantly withstand impulse voltage noise fed back from the drain of the power switch HEMT 175 to the gate of the power switch HEMT 175. In various embodiments, the power switch HEMT 175 may have an even larger Vt like 2V. The disclosed circuit design for multi-Vt transistors can reduce Vt of the pull-up E-HEMT transistors and Vf of the diode-connected E-HEMT rectifiers of the multi-stage driver to provide enough over-drive voltage and dramatically reduce static current, without compromising the noise immunity of the output power switch. To manufacture multi-Vt transistors in a same IC on a same wafer, the transistors may be different in terms of: different gate materials (e.g. tungsten, nickel), different p-type doping materials (e.g. magnesium, beryllium) in corresponding polarization modulation portions, different thicknesses of corresponding active portions, different material compositions (e.g. aluminum compositions) of corresponding active portions, and/or different material structures (e.g. homogeneous or graded) of corresponding active portions.

Figure 2A:
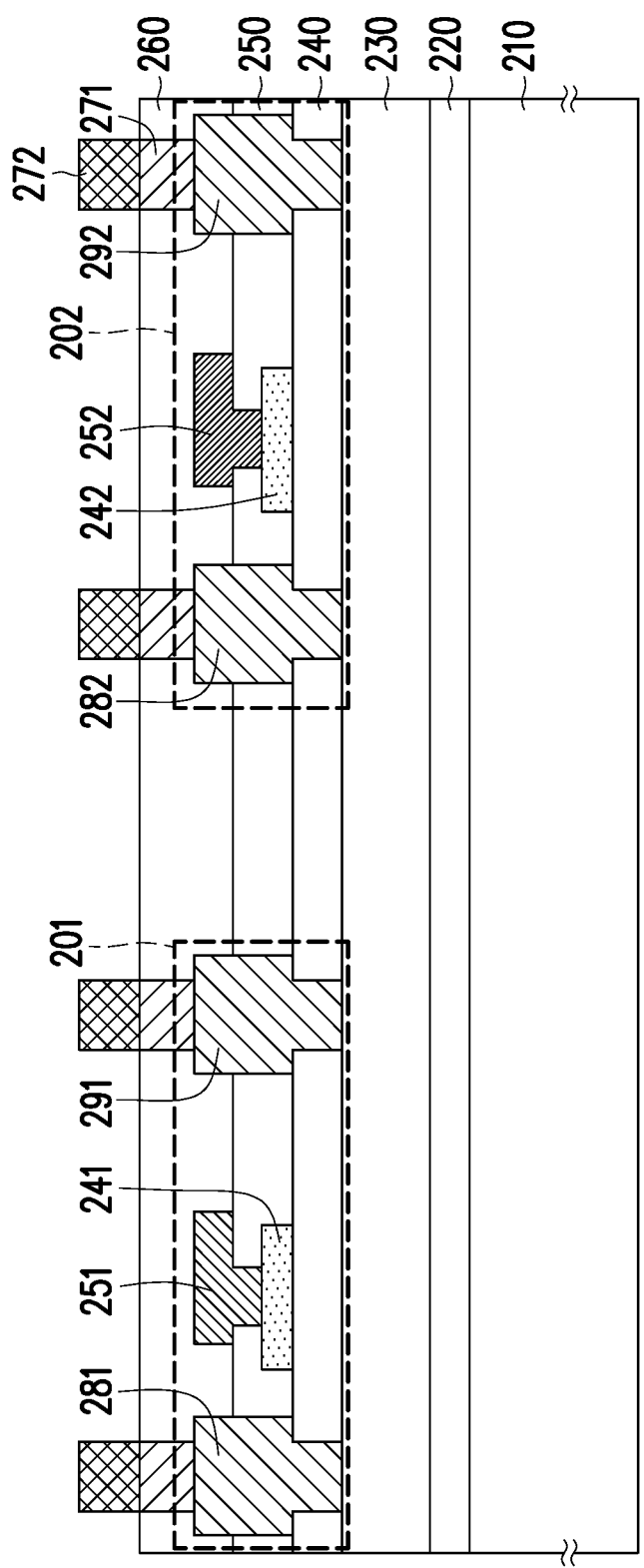
FIGS. 2A, 2B, 2C, 2D, 2E, 2F illustrate cross-sectional views of exemplary semiconductor devices each including transistors with different threshold voltages, in accordance with some embodiments of the present disclosure.

FIG. 2A illustrates a cross-sectional view of an exemplary semiconductor device 200-1 including transistors with different threshold voltages, in accordance with some embodiments of the present disclosure. As shown in FIG. 2A, the semiconductor device 200-1 in this example includes a silicon layer 210 and a transition layer 220 disposed on the silicon layer 210. The semiconductor device 200-1 further includes a first layer 230 comprising a first III-V semiconductor material formed over the transition layer 220.

The semiconductor device 200-1 further includes a second layer 240 (a polarization layer) comprising a second III-V semiconductor material disposed on the first layer 230. The second III-V semiconductor material is different from the first III-V semiconductor material. For example, the first III-V semiconductor material may be gallium nitride (GaN); while the second III-V semiconductor material may be aluminum gallium nitride (AlGaN).

As shown in FIG. 2A, the semiconductor device 200-1 further includes a first transistor 201 and a second transistor 202 formed over the first layer 230. The first transistor 201 comprises a first gate structure 251 comprising a first material, a first source region 281 and a first drain region 291. The second transistor 202 comprises a second gate structure 252 comprising a second material, a second source region 282 and a second drain region 292. According to various embodiments, the first material is different from the second material.

The semiconductor device 200-1 further includes a polarization modulation layer 241, 242 disposed on the second layer 240, and a passivation layer 250 disposed partially on the polarization modulation layer and partially on the second layer 240. In one embodiment, the polarization modulation layer comprises p-type doped GaN (pGaN).

The sources 281, 282 and the drains 291, 292 of the two transistors 201, 202 are formed through the second layer 240 and the passivation layer 250, and disposed on the first layer 230. The first gate structure 251 is disposed on the pGaN portion 241 and between the first source region 281 and the first drain region 291. The second gate structure 252 is disposed on the pGaN portion 242 and between the second source region 282 and the second drain region 292.

In one embodiment, the first transistor 201 and the second transistor 202 are high electron mobility transistors to be used in a same multi-stage driver circuit. For example, the first transistor 201 is used as a power switch transistor and has a first threshold voltage. The second transistor 202 is used as a driver transistor and has a second threshold voltage that is lower than the first threshold voltage. Accordingly, the first material of the first gate structure 251 has a lower work-function than the second material of the second gate structure 252. For example, the first material comprises tungsten (W) and/or a titanium/tungsten/titanium-nitride (Ti/W/TiN) metal stack; and the second material comprises nickel (Ni) and/or a titanium/nickel/titanium-nitride (Ti/Ni/TiN) metal stack.

In addition, the semiconductor device 200-1 includes an interlayer dielectric (ILD) layer 260 disposed partially on the passivation layer 250 and partially on the first transistor 201 and the second transistor 202. The semiconductor device 200-1 also includes metal contacts 271 disposed on and in contact with the sources 281, 282 and the drains 291, 292 respectively, and includes a first metal layer 272 on the metal contacts 271.

Figure 2B:
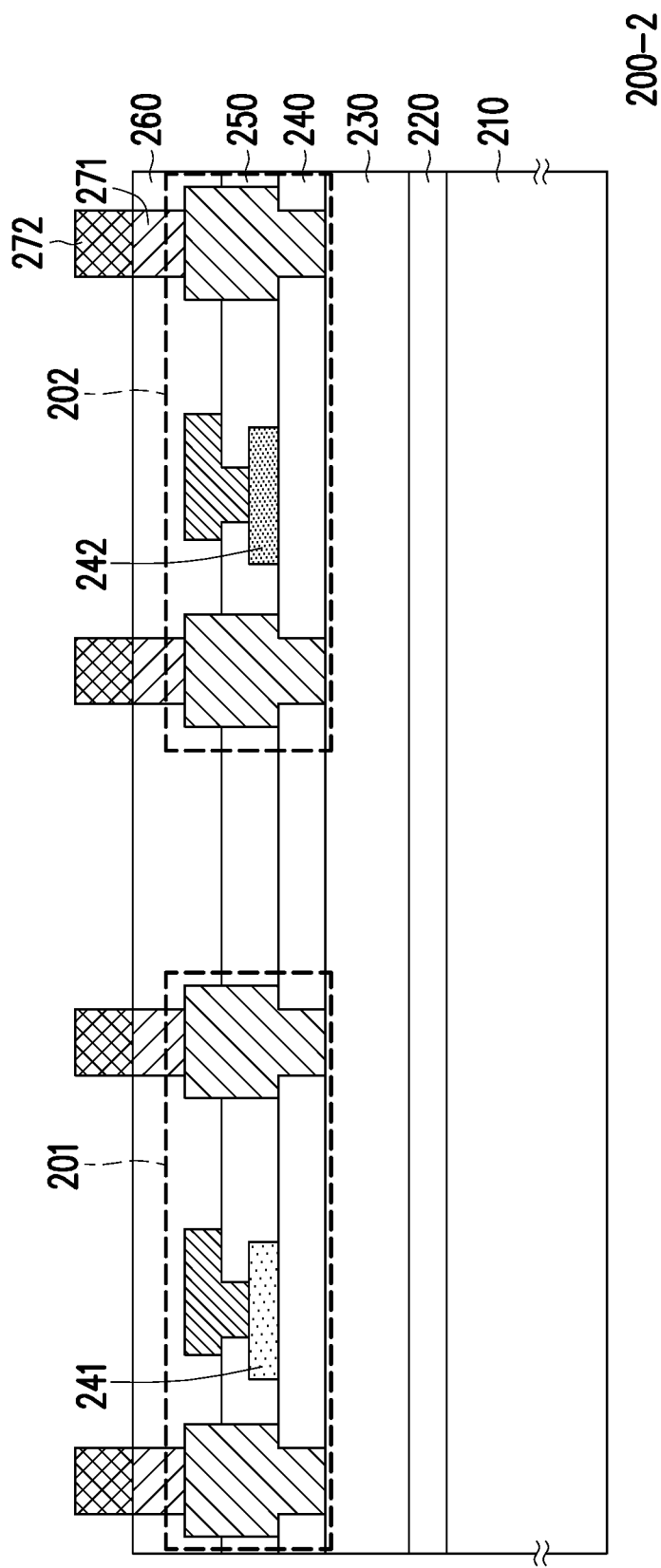

FIG. 2B illustrates a cross-sectional view of an exemplary semiconductor device 200-2 including transistors with different threshold voltages, in accordance with some embodiments of the present disclosure. The semiconductor device 200-2 in FIG. 2B is similar to the semiconductor device 200-1 in FIG. 2A, except that the metal gates of the first transistor 201 and the second transistor 202 in the semiconductor device 200-2 has a same gate material. As shown in FIG. 2B, the first pGaN portion 241 of the first transistor 201 in this example includes a different p-type doping material from that in the second pGaN portion 242 of the second transistor 202.

In one embodiment, the first transistor 201 and the second transistor 202 are high electron mobility transistors to be used in a same multi-stage driver circuit. For example, the first transistor 201 is used as a power switch transistor and has a first threshold voltage. The second transistor 202 is used as a driver transistor and has a second threshold voltage that is lower than the first threshold voltage. Accordingly, the p-type doping material of the first polarization modulation portion 241 has a higher (larger) work-function than the p-type doping material of the second polarization modulation portion 242. For example, the first polarization modulation portion 241 is doped with Be, while the second polarization modulation portion 242 is doped with Mg.

Figure 2C:
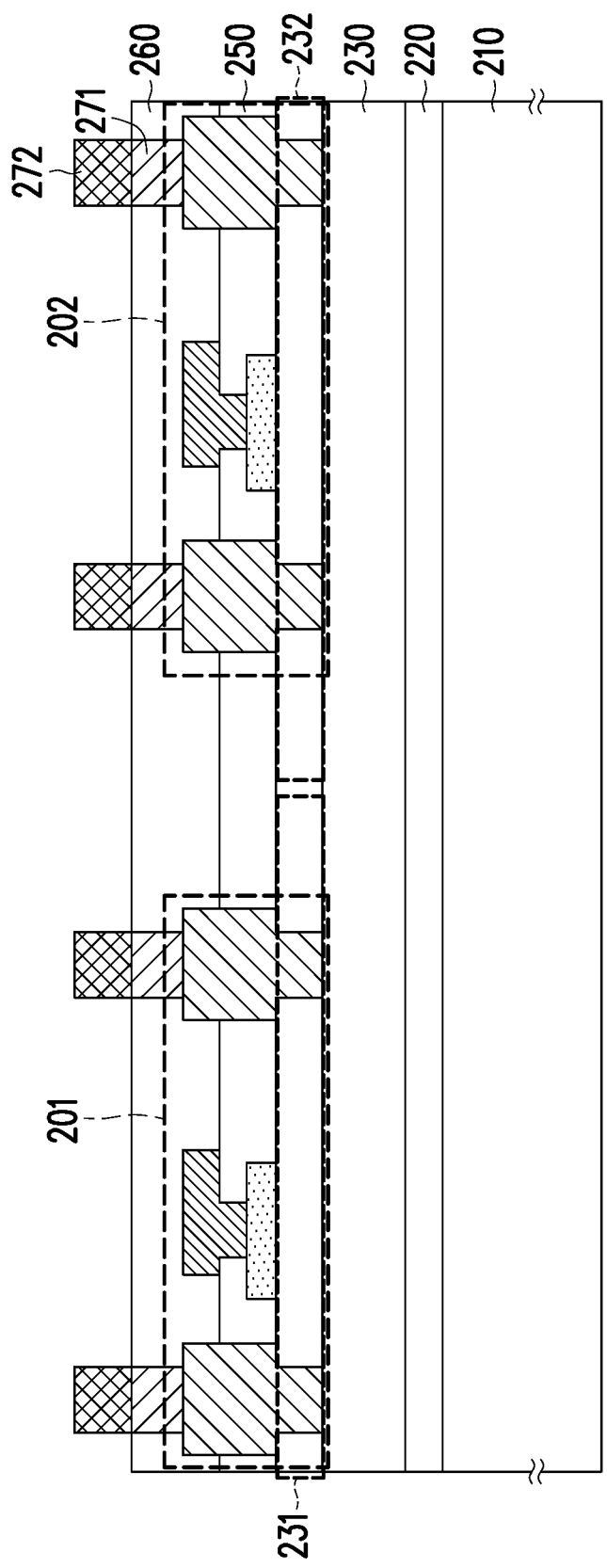

FIG. 2C illustrates a cross-sectional view of an exemplary semiconductor device 200-3 including transistors with different threshold voltages, in accordance with some embodiments of the present disclosure. The semiconductor device 200-3 in FIG. 2C is similar to the semiconductor device 200-1 in FIG. 2A, except that the metal gates of the first transistor 201 and the second transistor 202 in the semiconductor device 200-2 has a same gate material. As shown in FIG. 2C, the active AlGaN portions 231, 232 in the semiconductor device 200-3 under the first transistor 201 and the second transistor 202 have different Al compositions. As shown in FIG. 2C, the active AlGaN layer in this example includes a first active portion 231 under the gate of the first transistor 201 and a second active portion 232 under the gate of the second transistor 202. The first active portion 231 has a different Al composition (x) from the Al composition (y) of the second active portion 232.

In one embodiment, the first transistor 201 and the second transistor 202 are high electron mobility transistors to be used in a same multi-stage driver circuit. For example, the second transistor 202 is used as a power switch transistor and has a first threshold voltage. The first transistor 201 is used as a driver transistor and has a second threshold voltage that is lower than the first threshold voltage. Accordingly, the first active portion 231 under the gate of the first transistor 201 has a higher Al composition than the second active portion 232 under the gate of the second transistor 202 to introduce a higher polarization.

Figure 2D:
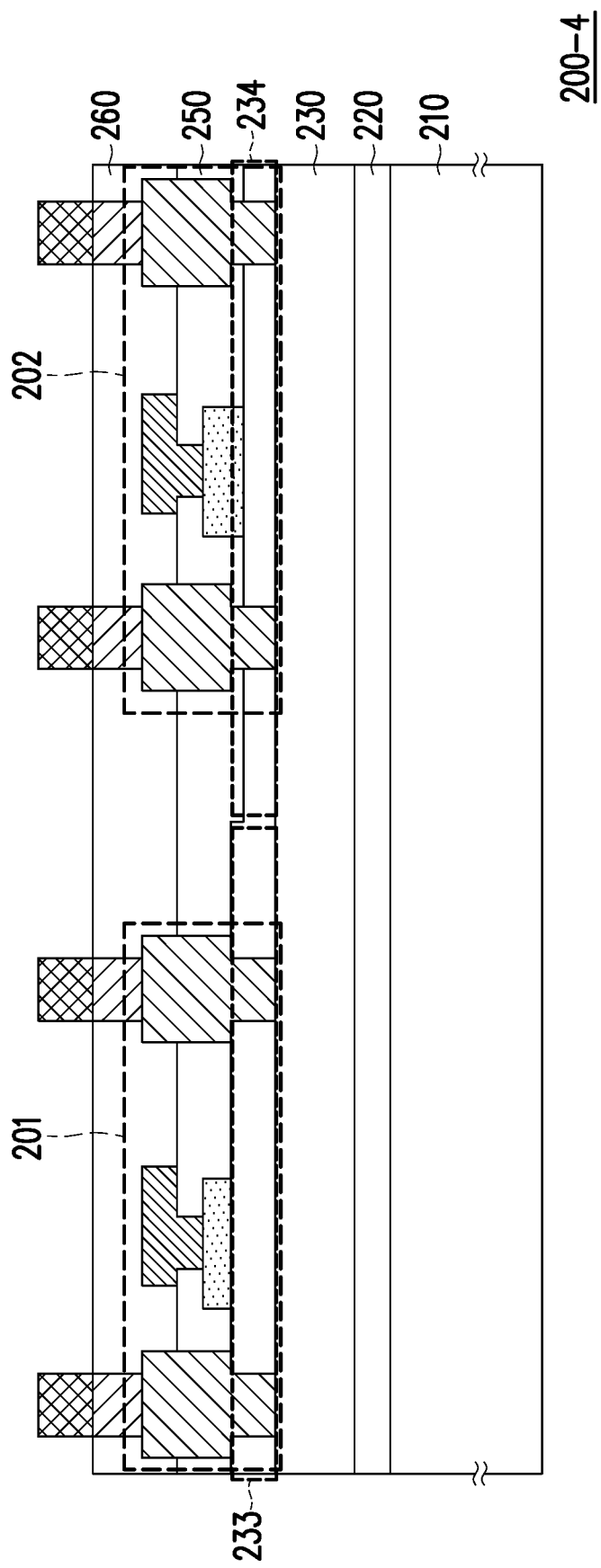

FIG. 2D illustrates a cross-sectional view of an exemplary semiconductor device 200-4 including transistors with different threshold voltages, in accordance with some embodiments of the present disclosure. The semiconductor device 200-4 in FIG. 2D is similar to the semiconductor device 200-1 in FIG. 2A, except that the metal gates of the first transistor 201 and the second transistor 202 in the semiconductor device 200-2 has a same gate material. As shown in FIG. 2D, the active AlGaN portions 233, 234 in the semiconductor device 200-3 under the first transistor 201 and the second transistor 202 have different thicknesses. As shown in FIG. 2D, the active AlGaN layer in this example includes a first active portion 233 under the gate of the first transistor 201 and a second active portion 234 under the gate of the second transistor 202. The first active portion 233 is thicker than the second active portion 234.

In one embodiment, the first transistor 201 and the second transistor 202 are high electron mobility transistors to be used in a same multi-stage driver circuit. For example, the second transistor 202 is used as a power switch transistor and has a first threshold voltage. The first transistor 201 is used as a driver transistor and has a second threshold voltage that is lower than the first threshold voltage. Accordingly, the first active portion 233 under the gate of the first transistor 201 is thicker than the second active portion 234 under the gate of the second transistor 202 to introduce a higher polarization.

Figure 2E:
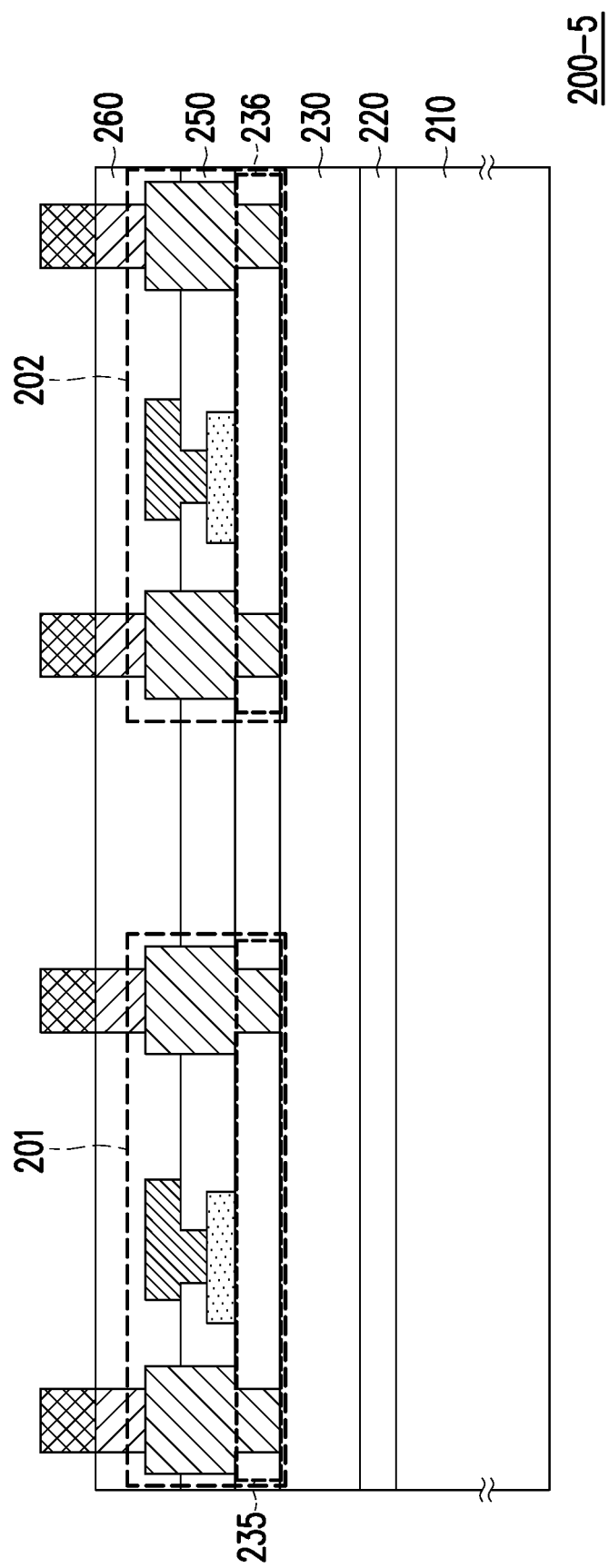

FIG. 2E illustrates a cross-sectional view of an exemplary semiconductor device 200-5 including transistors with different threshold voltages, in accordance with some embodiments of the present disclosure. The semiconductor device 200-5 in FIG. 2E is similar to the semiconductor device 200-1 in FIG. 2A, except that the metal gates of the first transistor 201 and the second transistor 202 in the semiconductor device 200-2 has a same gate material. The active AlGaN portions 235, 236 in the semiconductor device 200-5 under the first transistor 201 and the second transistor 202 have different material structures. As shown in FIG. 2E, the active AlGaN layer in this example includes a first active portion 235 under the gate of the first transistor 201 and a second active portion 236 under the gate of the second transistor 202. While the first active portion 235 has a homogeneous structure that comprises AlGaN with a single constant Al proportion, the second active portion 236 has graded structure that includes a plurality of sub-layers each of which comprises AlGaN with a different Al proportion. In one embodiment, the first transistor 201 and the second transistor 202 are high electron mobility transistors to be used in a same multi-stage driver circuit. For example, the second transistor 202 is used as a power switch transistor and has a first threshold voltage. The first transistor 201 is used as a driver transistor and has a second threshold voltage that is lower than the first threshold voltage.

In some embodiments, the Aluminum composition in the second active portion 236 goes from low to high from its bottom, when the first III-V semiconductor material is GaN in the first layer 230 and when the second III-V semiconductor material is $Al_xGa_{1-x}N$ in the second active portion 236. For example, x=0% at the interface between the second active portion 236 and the first layer 230. Then x is increased gradually from 0% to e.g. ~50% for the second active portion 236. The graded $Al_xGa_{1-x}N$ layer can significantly conform (pseudomorphic) to the GaN layer to get a virtually misfit-dislocation-free (and threading-dislocation-free) $Al_xGa_{1-x}N$/GaN interface as a result in trap free.

Figure 2F:
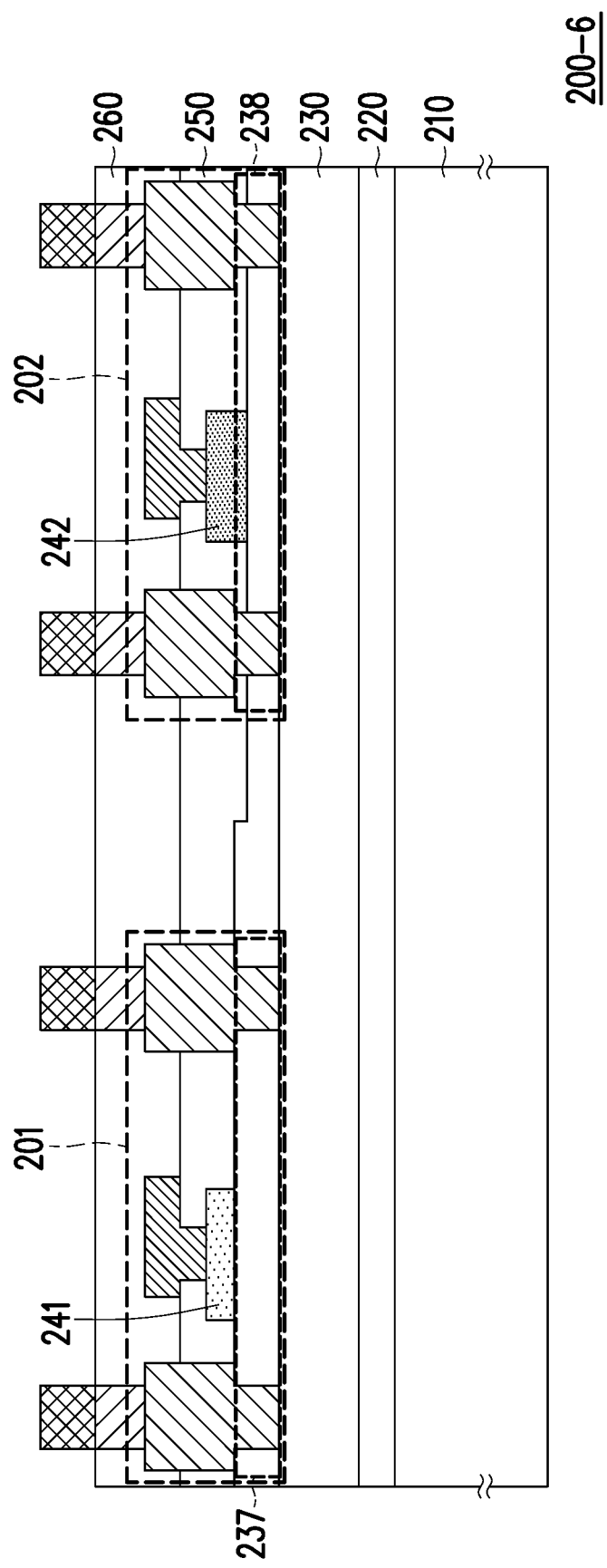

FIG. 2F illustrates a cross-sectional view of an exemplary semiconductor device 200-6 including transistors with different threshold voltages, in accordance with some embodiments of the present disclosure. The semiconductor device 200-6 in FIG. 2F is similar to the semiconductor device 200-2 in FIG. 2B, except that: in addition to the p-type doping material difference in the pGaN portions 241, 242, the active AlGaN portions 237, 238 in the semiconductor device 200-6 under the first transistor 201 and the second transistor 202 have different thicknesses and different material structures. As shown in FIG. 2F, the active AlGaN layer in this example includes a first active portion 237 under the gate of the first transistor 201 and a second active portion 238 under the gate of the second transistor 202. While the first active portion 237 has a homogeneous structure that comprises AlGaN with a single constant Al proportion, the second active portion 238 has graded structure that includes a plurality of sub-layers each of which comprises AlGaN with a different Al proportion. In addition, the second active portion 238 is thinner than the first active portion 237. In one embodiment, the first transistor 201 and the second transistor 202 are high electron mobility transistors to be used in a same multi-stage driver circuit. For example, the second transistor 202 is used as a power switch transistor and has a first threshold voltage. The first transistor 201 is used as a driver transistor and has a second threshold voltage that is lower than the first threshold voltage.

Figure 3A:
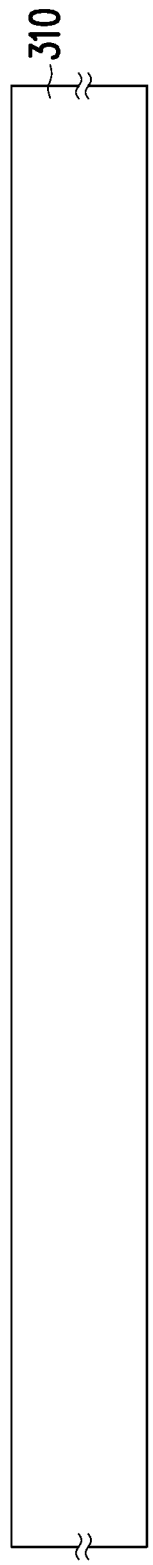

FIGS. 3A, 3B, 3C, 3D, 3E, 3F, 3G, 3H, 3I, 3J, 3K, 3L, 3M, 3N, 3O, 3P and 3Q illustrate cross-sectional views of an exemplary semiconductor device during various fabrication stages, in accordance with some embodiments of the present disclosure. In some embodiments, the semiconductor device may be included in an integrated circuit (IC). In addition, FIGS. 3A through 3Q are simplified for a better understanding of the concepts of the present disclosure. For example, although the figures illustrate two transistors, it is understood the semiconductor device may include more than two transistors, and the IC may include a number of other devices comprising resistors, capacitors, inductors, fuses, etc., which are not shown in FIGS. 3A through 3Q, for purposes of clarity of illustration.

FIG. 3A is a cross-sectional view of the semiconductor device including a substrate 310, which is provided at one of the various stages of fabrication, according to some embodiments of the present disclosure. The substrate 310 may be formed of silicon, as shown in FIG. 3A, or another semiconductor material.

Figure 3B:
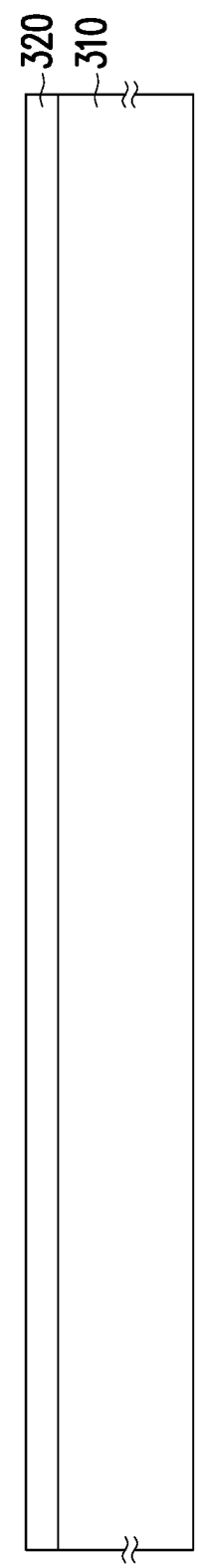

FIG. 3B is a cross-sectional view of the semiconductor device including a transition or buffer layer 320, which is formed on the substrate 310 at one of the various stages of fabrication, according to some embodiments of the present disclosure. The transition or buffer layer 320 may be formed by epitaxial growth. According to various embodiments, the transition or buffer layer 320 includes a nucleation layer of aluminum nitride (AlN) and serves as a buffer to reduce the stress between the substrate 310 and the layer on top of the transition or buffer layer 320. In one embodiment, the transition or buffer layer 320 and the operation step shown in FIG. 3B is optional and can be removed.

Figure 3C:
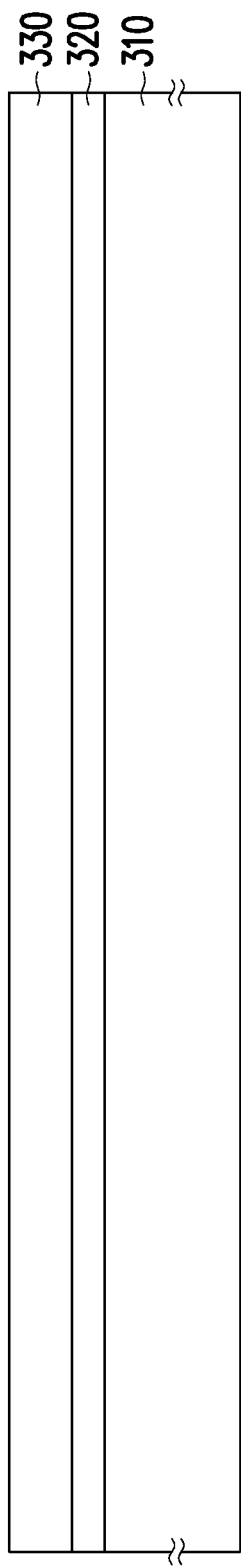

FIG. 3C is a cross-sectional view of the semiconductor device including a first III-V semiconductor material layer 330, which is formed optionally on the transition or buffer layer 320 or directly on the substrate 310 at one of the various stages of fabrication, according to some embodiments of the present disclosure. The first III-V semiconductor material layer 330 may be formed by epitaxial growth. According to various embodiments, the first III-V semiconductor material layer 330 includes a gallium nitride (GaN). When the first III-V semiconductor material layer 330 is formed on the transition or buffer layer 320, the transition or buffer layer 320 can reduce the stress between the substrate 310 and the first III-V semiconductor material layer 330. After transistors are formed over the first III-V semiconductor material layer 330, the first III-V semiconductor material layer 330 serves as a channel layer for the transistors.

Figure 3D:
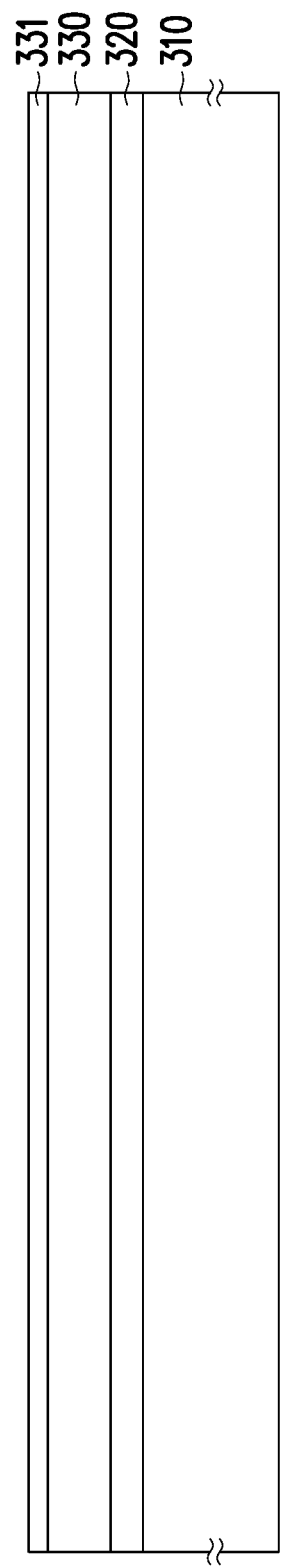

FIG. 3D is a cross-sectional view of the semiconductor device including a second III-V semiconductor material layer 331, which is formed on the first III-V semiconductor material layer 330 at one of the various stages of fabrication, according to some embodiments of the present disclosure. The second III-V semiconductor material layer 331 may be formed by epitaxial growth. According to various embodiments, the second III-V semiconductor material layer 331 includes an aluminum gallium nitride (AlGaN). After transistors are formed over the first III-V semiconductor material layer 330 and the second III-V semiconductor material layer 331, a 2-dimensional electron gas (2-DEG) will be formed at the interface between the first III-V semiconductor material layer 330 and the second III-V semiconductor material layer 331.

Figure 3E:
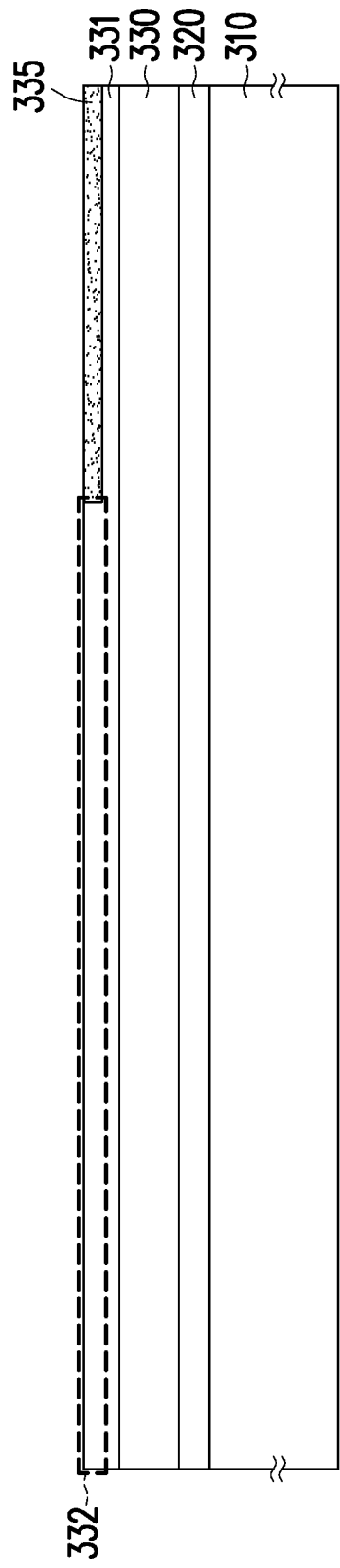

FIG. 3E is a cross-sectional view of the semiconductor device including a third III-V semiconductor material layer 332, which is formed on a portion of the second III-V semiconductor material layer 331 with a mask 335 at one of the various stages of fabrication, according to some embodiments of the present disclosure. The third III-V semiconductor material layer 332 may be formed by epitaxial growth. According to various embodiments, the third III-V semiconductor material layer 332 includes an aluminum gallium nitride (AlGaN). That is, while the second III-V semiconductor material layer 331 is a first AlGaN layer on the GaN layer 330, the third III-V semiconductor material layer 332 is a second AlGaN layer on the GaN layer 330. As shown in FIG. 3E, with the mask 335 covering the right portion of the first AlGaN layer 331, the second AlGaN layer 332 is disposed on the left and middle portions of the first AlGaN layer 331, i.e. disposed over the left and middle portions of the first III-V semiconductor material layer 330. In this example, the second AlGaN layer 332 has a same Al composition as the first AlGaN layer 331.

Figure 3F:
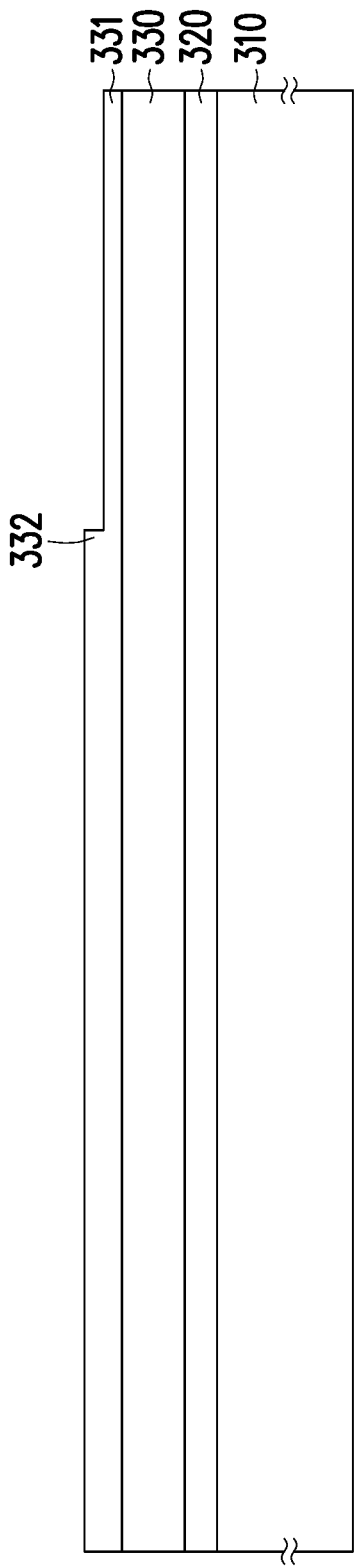

FIG. 3F is a cross-sectional view of the semiconductor device, where the mask 335 is removed from the first AlGaN layer 331 after the second AlGaN layer 332 is formed, at one of the various stages of fabrication, according to some embodiments of the present disclosure. After the mask 335 is removed, the AlGaN layer on the GaN layer 330 has different thicknesses at different locations of the wafer. In particular, the left and middle portions of the AlGaN layer are thicker than the right portion of the AlGaN layer.

Figure 3G:
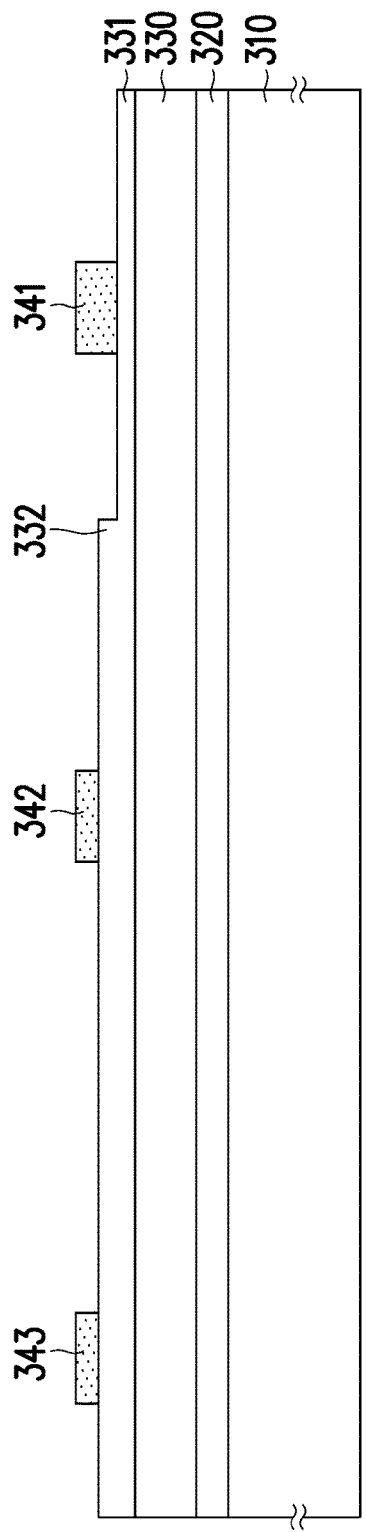

FIG. 3G is a cross-sectional view of the semiconductor device including a p-type doped GaN (pGaN) layer 341, 342, 343 which is formed on the AlGaN layers 331, 332 at one of the various stages of fabrication, according to some embodiments of the present disclosure. The pGaN layer 341, 342, 343 is patterned to form island regions shown in FIG. 3G. The patterning of the pGaN layer includes, e.g., (i) forming a masking layer (e.g., photoresist, etc.) over the pGaN layer, the masking layer including openings over the portions of the pGaN layer that are to be removed, and (ii) removing the portions of the pGaN layer that are left exposed by the masking layer (e.g., via a wet or dry etch procedure). The pGaN layer 341, 342, 343 may be called a polarization modulation layer, which modulates the dipole concentration in the AlGaN layers 331, 332 to result in changing the 2-DEG concentration in the AlGaN/GaN interface channel. While the polarization modulation layer is formed for an enhancement-mode (normally off) AlGaN/GaN HEMT, the polarization modulation layer is not needed in a depletion-mode (normally on) AlGaN/GaN HEMT.

Figure 3H:
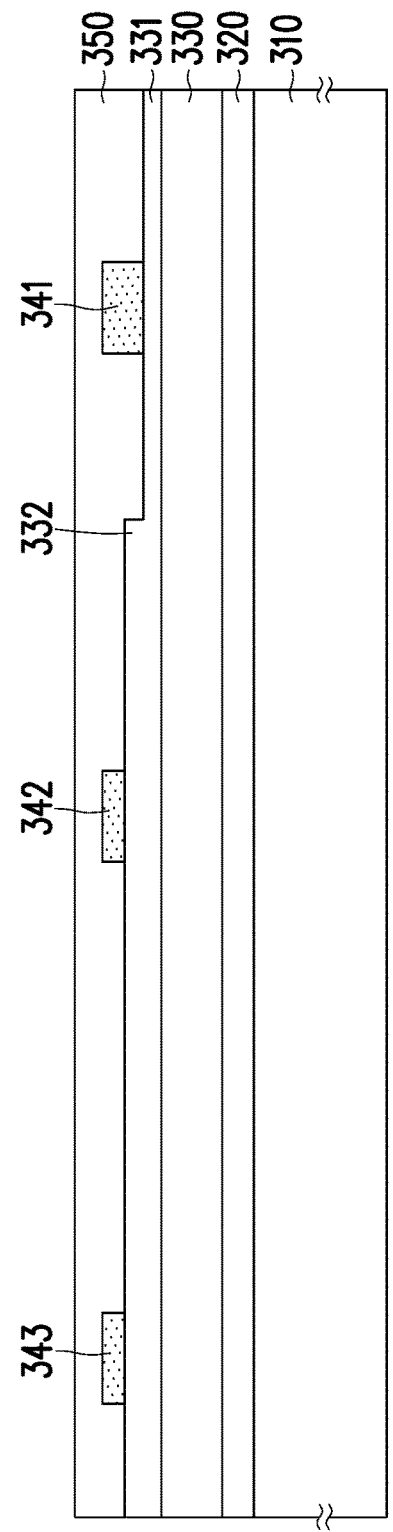

FIG. 3H is a cross-sectional view of the semiconductor device including a passivation layer 350, which is formed on the AlGaN layers 331, 332, and the polarization modulation layer at one of the various stages of fabrication, according to some embodiments of the present disclosure. The passivation layer 350 is formed over the AlGaN layers 331, 332 and over the remaining portions of the polarization modulation layer 341, 342, 343. According to various embodiments, the passivation layer 350 is formed using a deposition procedure (e.g., chemical deposition, physical deposition, etc.). The passivation layer 350 may comprise silicon oxide, silicon nitride, silicon oxynitride, carbon doped silicon oxide, carbon doped silicon nitride, carbon doped silicon oxynitride, zinc oxide, zirconium oxide, hafnium oxide, titanium oxide, or another suitable material. In one embodiment, after depositing the passivation layer 350, the passivation layer 350 undergoes a polishing and/or etching procedure. The polishing and/or etching procedure includes, e.g. a chemical-mechanical planarization (CMP) (i.e., chemical-mechanical polishing) process that is used to polish the surface of the passivation layer 350 and remove topographical irregularities.

Figure 3I:
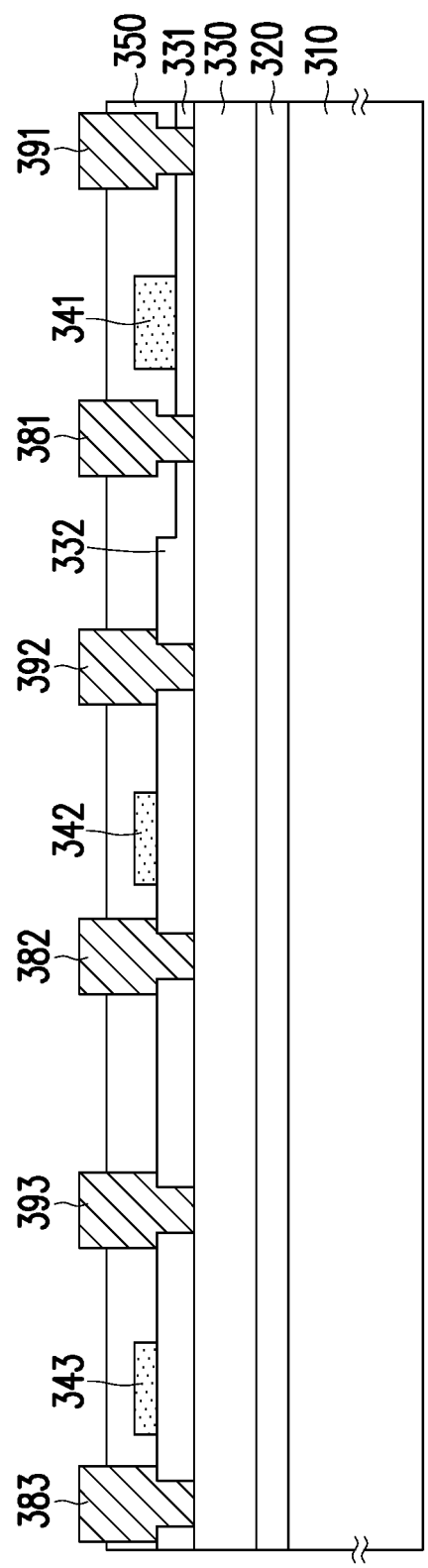

FIG. 3I is a cross-sectional view of the semiconductor device including source and drain contacts 381, 391, 382, 392, 383, 393, which are formed through the AlGaN layers 331, 332, and the passivation layer 350 and disposed on the first III-V semiconductor material layer 330 at one of the various stages of fabrication, according to some embodiments of the present disclosure. The source and drain contacts may be formed as non-rectifying electrical junctions, i.e. ohmic contacts.

Figure 3J:
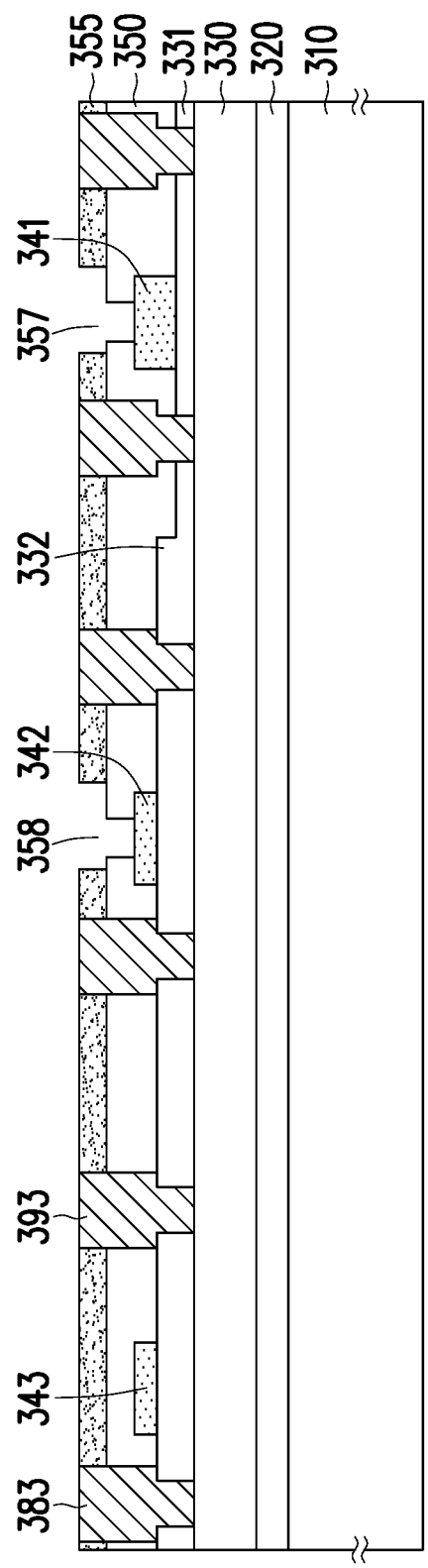

FIG. 3J is a cross-sectional view of the semiconductor device including a mask 355, which is formed on the passivation layer 350 at one of the various stages of fabrication, according to some embodiments of the present disclosure. At this stage, the mask 355 has a pattern to expose portions of the passivation layer 350 on top of the pGaN portions 341, 342. As such, a first opening 357 is formed on the pGaN portion 341 between the first pair of source 381 and drain 391 by etching the passivation layer 350 with the patterned mask 355; and a second opening 358 is formed on the pGaN portion 342 between the second pair of source 382 and drain 392 by etching the passivation layer 350 with the patterned mask 355.

Figure 3K:
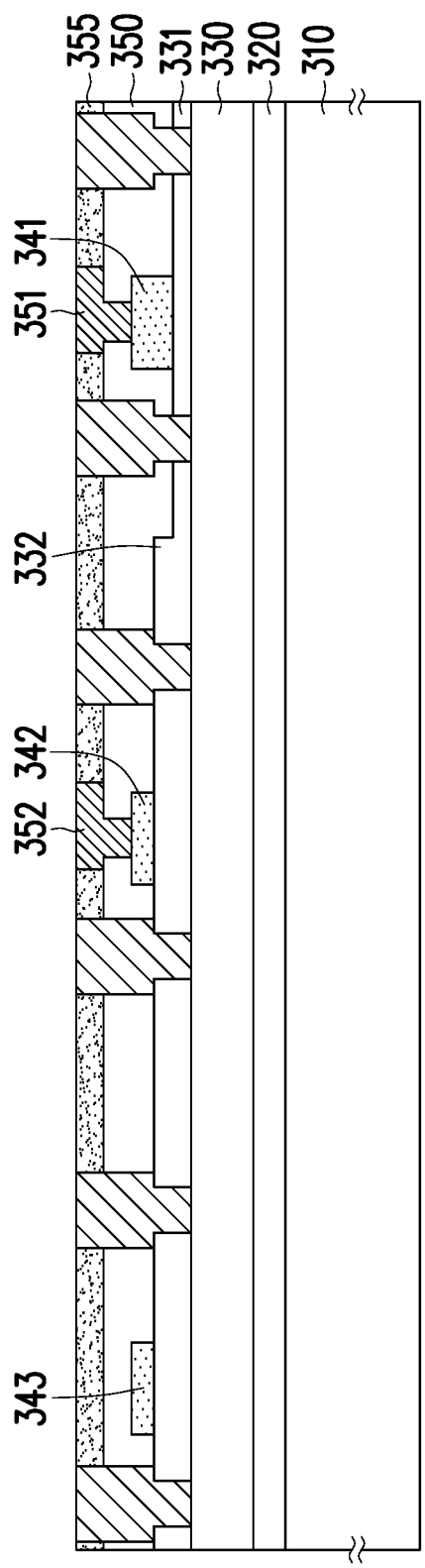

FIG. 3K is a cross-sectional view of the semiconductor device including a first gate 351 and a second gate 352, which are deposited and polished in the first opening 357 and the second opening 358 respectively at one of the various stages of fabrication, according to some embodiments of the present disclosure. According to various embodiments, the first gate 351 and the second gate 352 may be formed of metal materials like: tungsten (W), nickel (Ni), titanium/tungsten/titanium-nitride (Ti/W/TiN) metal stack, or titanium/nickel/titanium-nitride (Ti/Ni/TiN) metal stack.

Figure 3L:
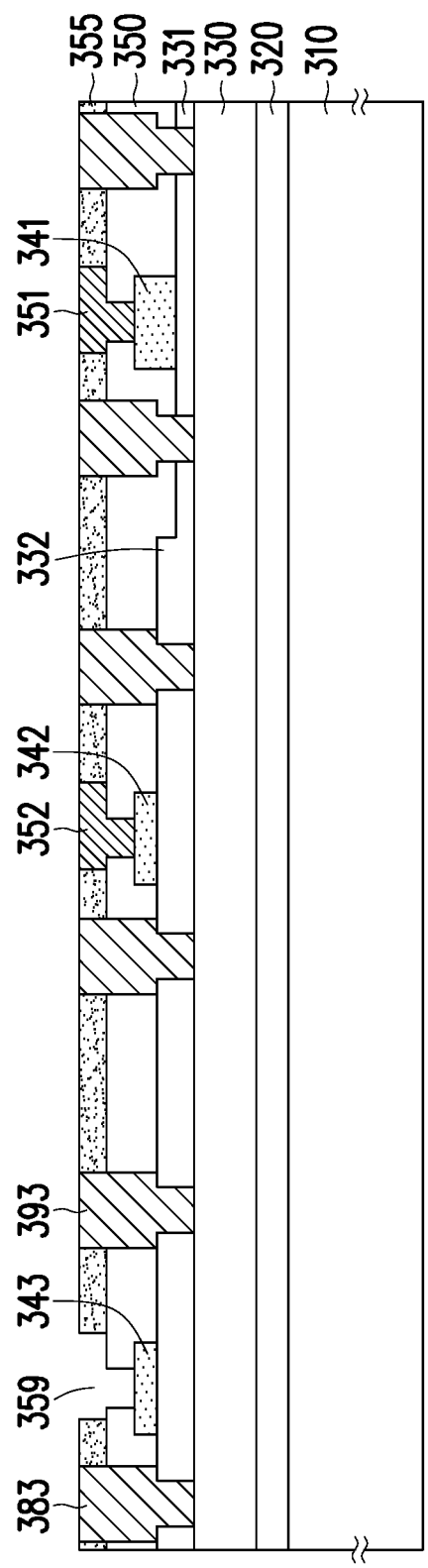

FIG. 3L is a cross-sectional view of the semiconductor device including the patterned mask 355, which is formed on the passivation layer 350 at one of the various stages of fabrication, according to some embodiments of the present disclosure. At this stage, the mask 355 has a pattern to expose a portion of the passivation layer 350 on top of the pGaN portion 343. As such, a third opening 359 is formed on the pGaN portion 343 between a third pair of source 383 and drain 393 by etching the passivation layer 350 with the patterned mask 355.

Figure 3M:
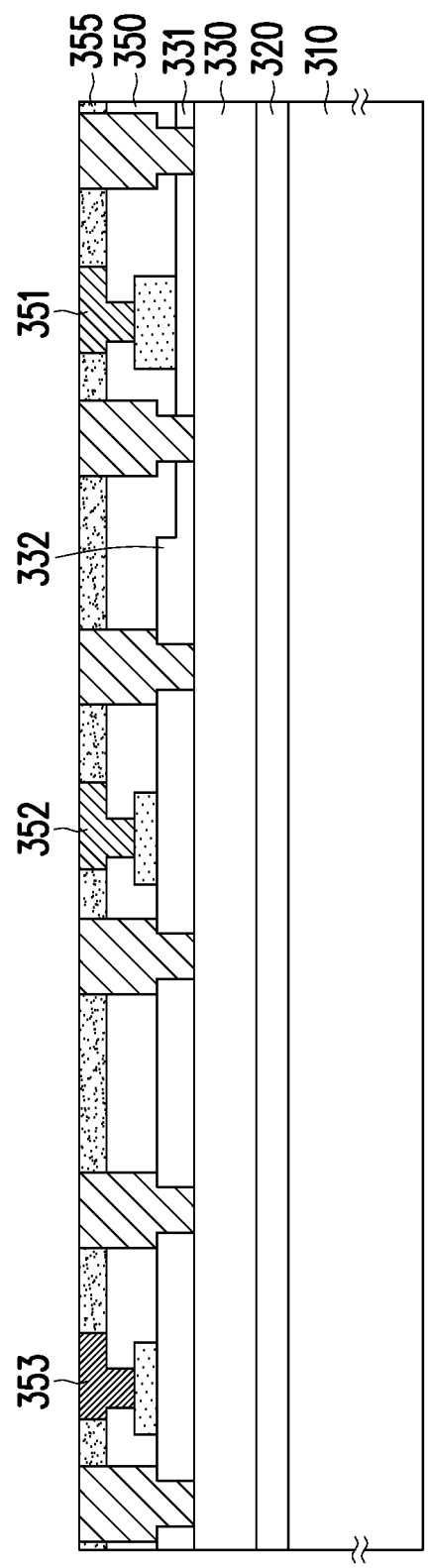

FIG. 3M is a cross-sectional view of the semiconductor device including a third gate 353, which is deposited and polished in the third opening 359 at one of the various stages of fabrication, according to some embodiments of the present disclosure. According to various embodiments, the third gate 353 may be formed of metal materials like: tungsten (W), nickel (Ni), titanium/tungsten/titanium-nitride (Ti/W/TiN) metal stack, or titanium/nickel/titanium-nitride (Ti/Ni/TiN) metal stack. In this example, the third gate 353 has a gate material different from those of the first gate 351 and the second gate 352.

Figure 3N:
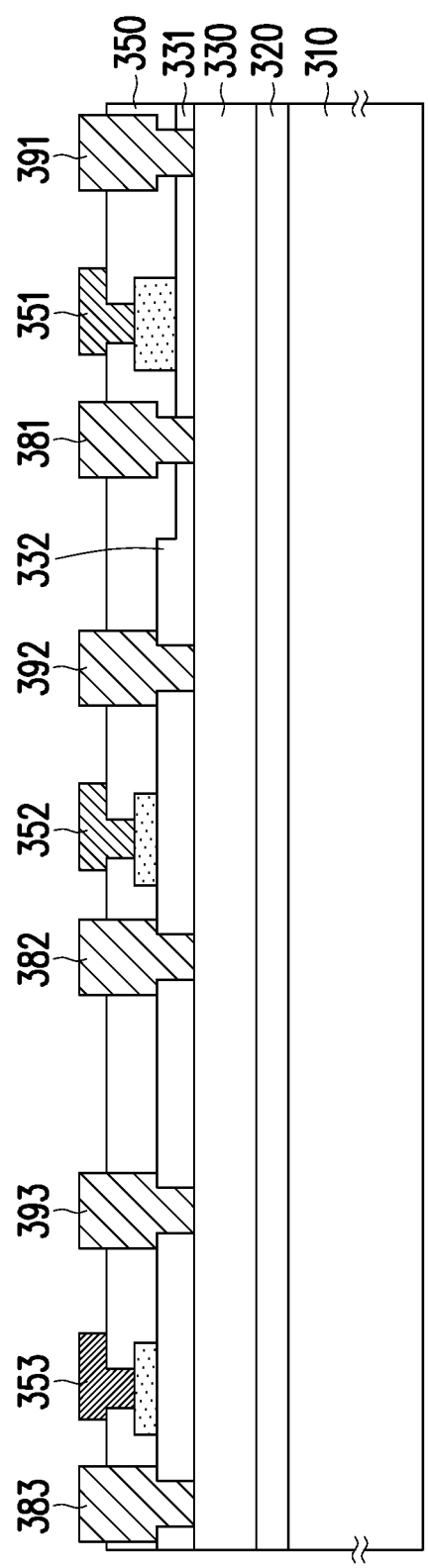
Figure 30:
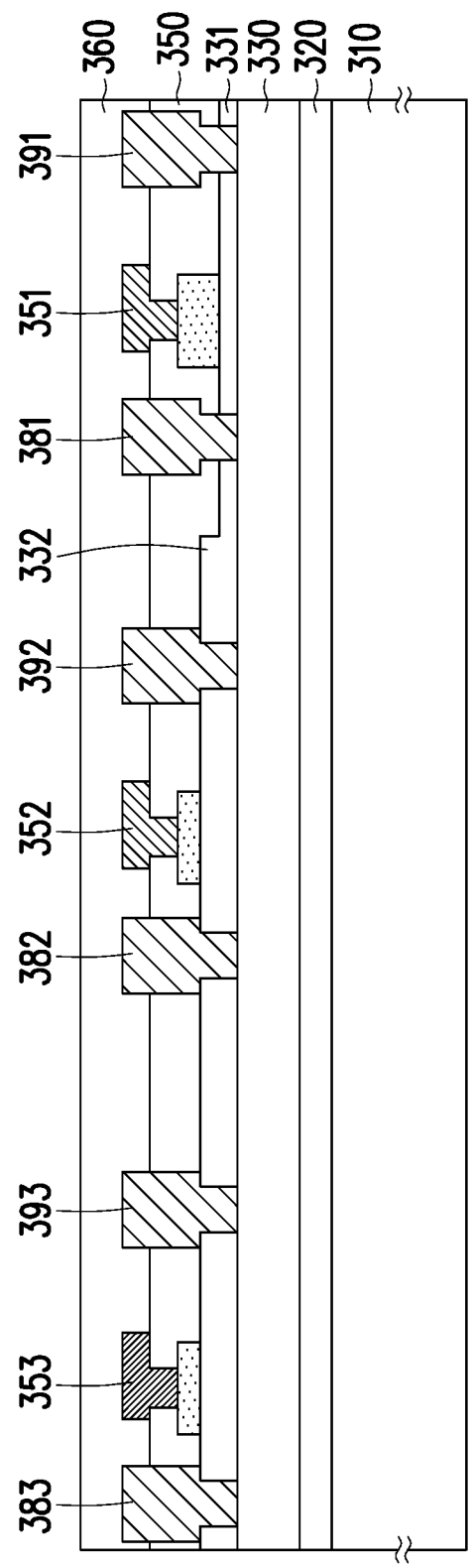

FIG. 3N is a cross-sectional view of the semiconductor device, where the mask 355 is removed from the passivation layer 350 after the metal gates are formed, at one of the various stages of fabrication, according to some embodiments of the present disclosure. After the mask 355 is removed, each of the source regions 381, 382, 383, the drain regions 391, 392, 393, and the gate structures 351, 352, 353 has an exposed portion on top of the passivation layer 350.

FIG. 3O is a cross-sectional view of the semiconductor device including an interlayer dielectric (ILD) layer 360, which is formed on the passivation layer 350, at one of the various stages of fabrication, according to some embodiments of the present disclosure. The ILD layer 360 covers the passivation layer 350 and the exposed portions of the source regions 381, 382, 383, the drain regions 391, 392, 393, and the gate structures 351, 352, 353 that are formed at the stage shown in FIG. 3N. The ILD layer 360 is formed of a dielectric material and may be patterned with holes for metal interconnects or contacts for the source and drain contacts 381, 382, 383, 391, 392, 393 as well as the gate structures 351, 352, 353.

Figure 3P:
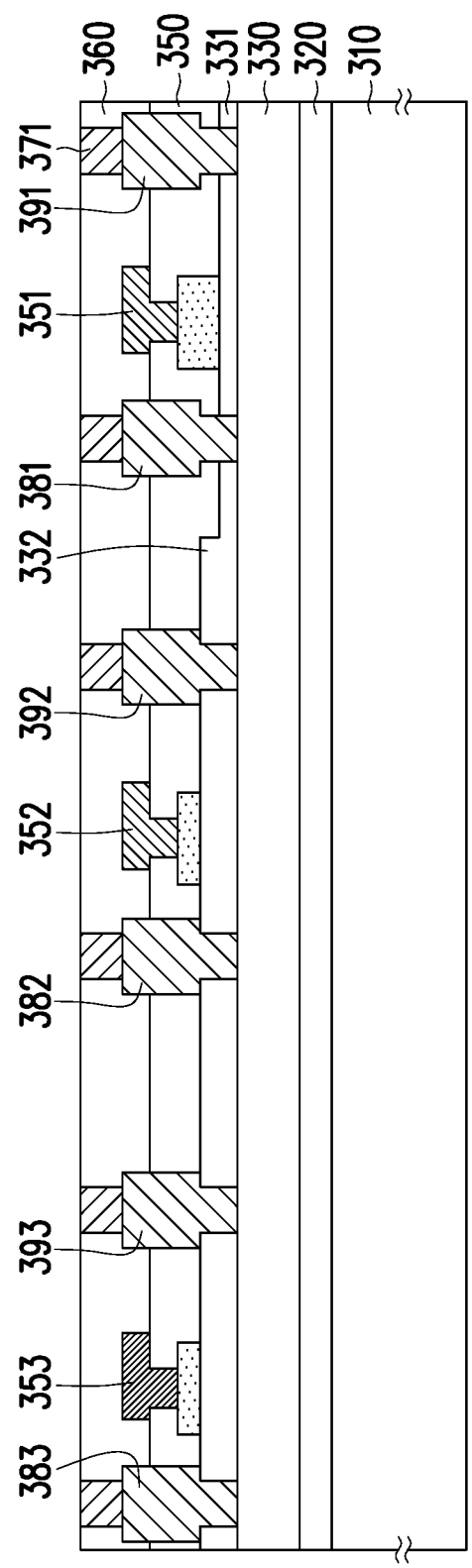
Figure 3Q:
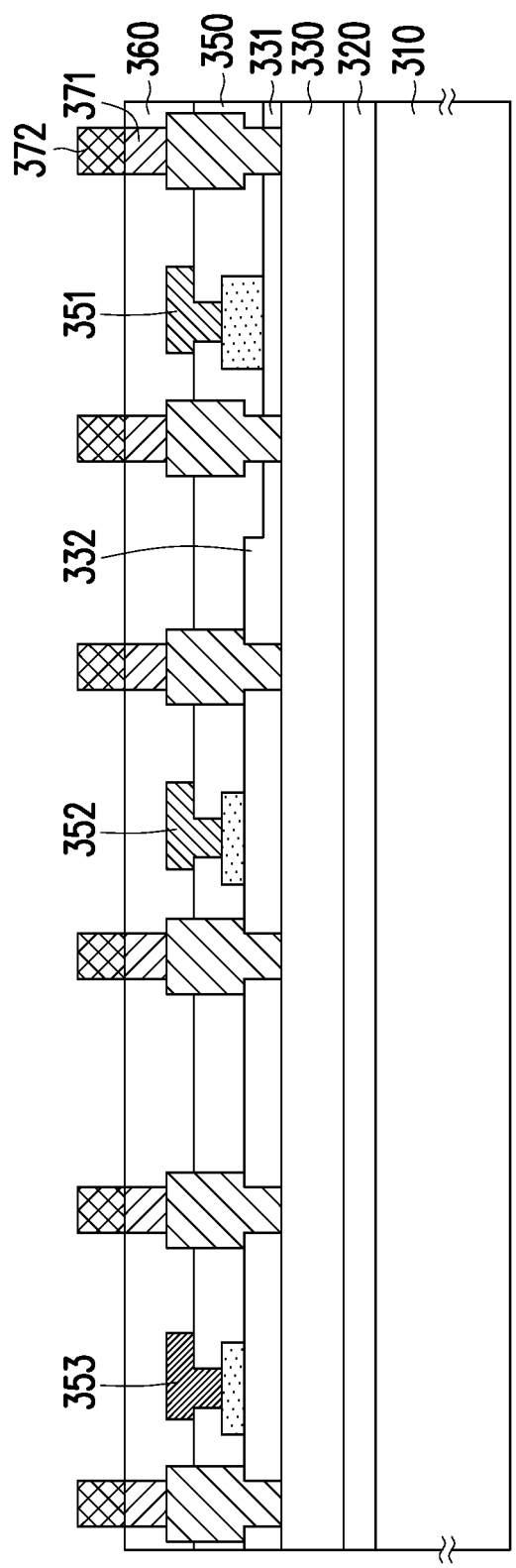

FIG. 3P is a cross-sectional view of the semiconductor device including metal contacts 371, each of which is formed on a source or drain contact, at one of the various stages of fabrication, according to some embodiments of the present disclosure. As discussed above, the ILD layer 360 is patterned with holes each of which is on one of the source and drain contacts 381, 382, 383, 391, 392, 393. As such, the metal contacts 371 can be formed in these holes to be in contact with the source and drain contacts 381, 382, 383, 391, 392, 393, respectively.

FIG. 3Q is a cross-sectional view of the semiconductor device including a first metal layer 372, which is formed on the metal contacts 371, at one of the various stages of fabrication, according to some embodiments of the present disclosure. The first metal layer 372 includes metal material and is formed over the ILD layer 360 and in contact with the metal contacts 371. As such, among the three transistors formed on the same wafer in FIG. 3Q, the left and the middle transistors have different gate materials but a same AlGaN portion thickness, while the middle and the right transistors have different AlGaN portion thicknesses but a same gate material.

Figure 4A:
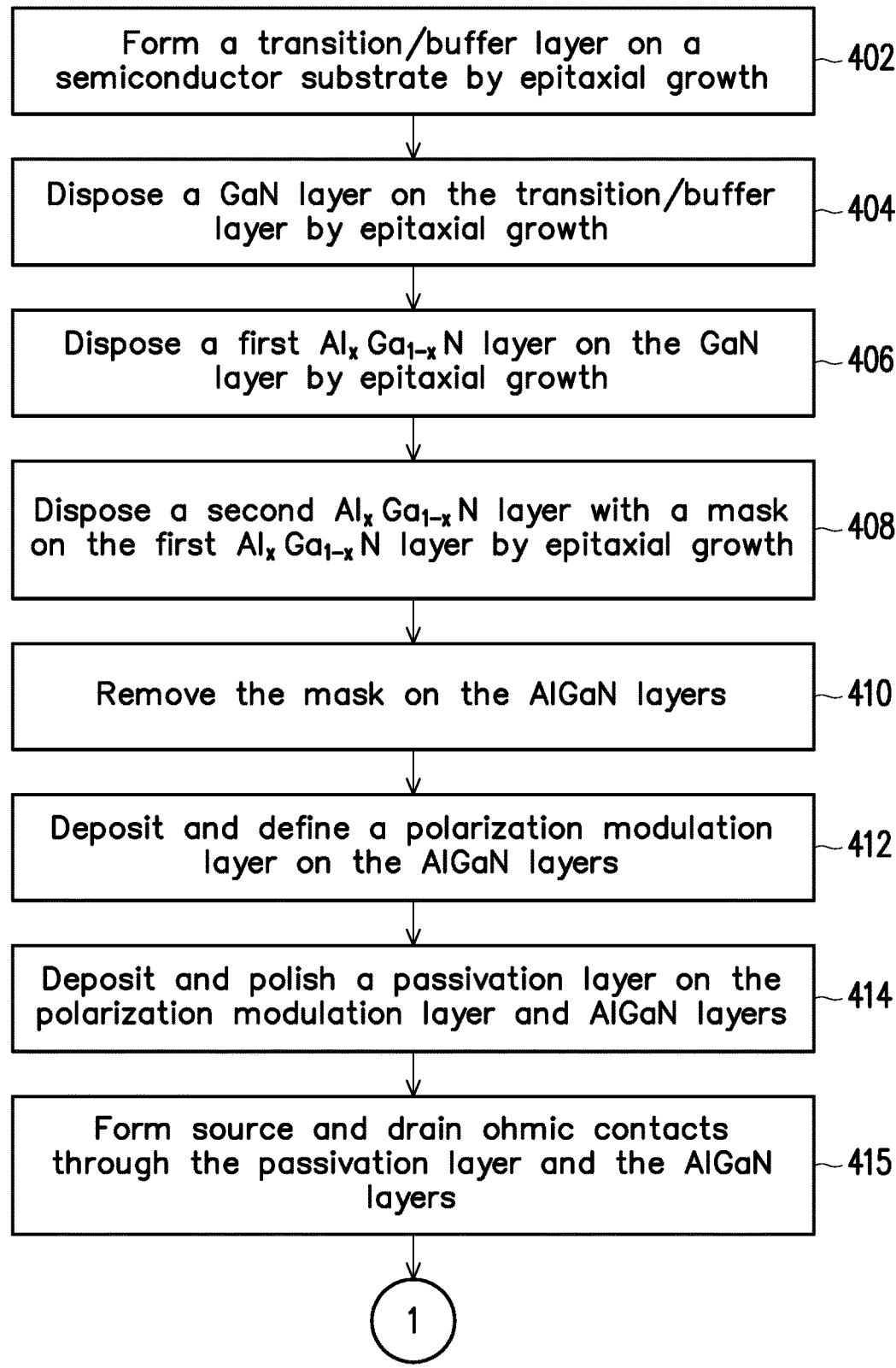
FIG. 4A and FIG. 4B show a flow chart illustrating an exemplary method for forming a semiconductor device including transistors with different threshold voltages, in accordance with some embodiments of the present disclosure.
Figure 4B:
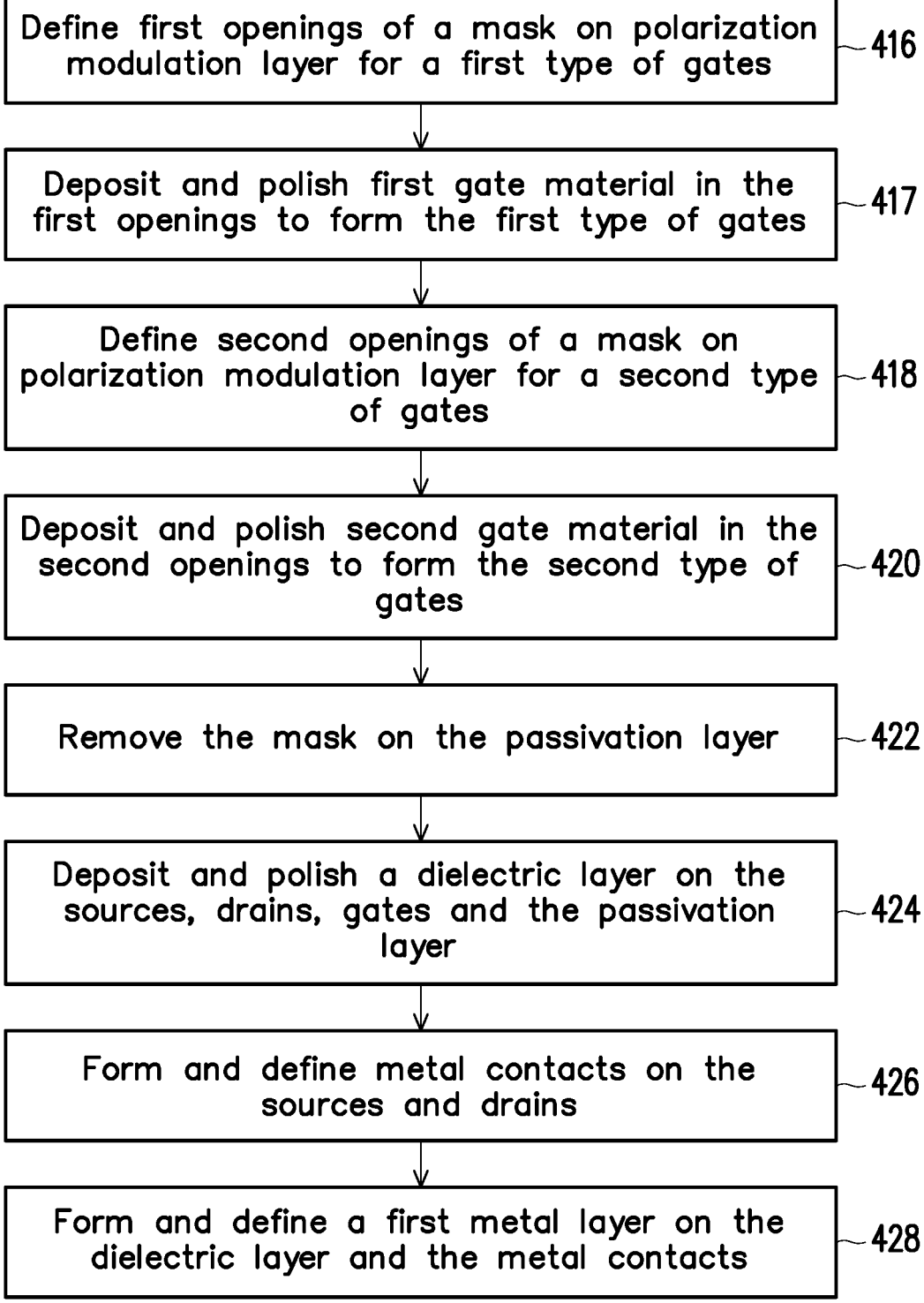

FIG. 4A and FIG. 4B show a flow chart illustrating an exemplary method 400 for forming a semiconductor device including transistors with different threshold voltages, in accordance with some embodiments of the present disclosure. As shown in FIG. 4A, at operation 402, a transition/buffer layer is formed on a semiconductor substrate by epitaxial growth. A GaN layer is formed at operation 404 on the transition/buffer layer by epitaxial growth. At operation 406, a first $Al_xGa_{1-x}N$ layer is formed on the GaN layer by epitaxial growth. At operation 408, a second $Al_xGa_{1-x}N$ layer is formed with a mask on the first $Al_xGa_{1-x}N$ layer by epitaxial growth. At operation 410, the mask on the AlGaN layers is removed. At operation 412, a polarization modulation layer is deposited and defined on the AlGaN layers. At operation 414, a passivation layer is deposited and polished on the polarization modulation layer and the AlGaN layers. At operation 415, source and drain ohmic contacts are formed through the passivation layer and the AlGaN layers. The process then goes to the operation 416 in FIG. 4B.

As shown in FIG. 4B, at operation 416, first openings of a mask are defined on the polarization modulation layer for a first type of gates. At operation 417, a first gate material is deposited and polished in the first openings to form the first type of gates. At operation 418, second openings of a mask are defined on the polarization modulation layer for a second type of gates. At operation 420, a second gate material is deposited and polished in the second openings to form the second type of gates. At operation 422, the mask on the passivation layer is removed. At operation 424, a dielectric layer is deposited and polished on the sources, drains, gates and the passivation layer. Metal contacts are formed and defined at operation 426 on the sources, drains and gates. At operation 428, a first metal layer is formed and defined on the dielectric layer and the metal contacts. The order of the operations shown in FIG. 4A and FIG. 4B may be changed according to different embodiments of the present disclosure.

In an embodiment, a semiconductor structure is disclosed. The semiconductor structure includes: a substrate; an active layer that is formed over the substrate and comprises a plurality of active portions; a polarization modulation layer comprising a plurality of polarization modulation portions each of which is disposed on a corresponding one of the plurality of active portions; and a plurality of transistors each of which comprises a source region, a drain region, and a gate structure formed on a corresponding one of the plurality of polarization modulation portions. The transistors have at least three different threshold voltages.

In another embodiment, a circuit is disclosed. The circuit includes a plurality of transistors each of which comprises: a source, a drain, a gate and a polarization modulation portion under the gate. The plurality of transistors are formed on a same semiconductor wafer including an active layer that comprises a plurality of active portions. The polarization modulation portion of each of the plurality of transistors is disposed on a corresponding one of the plurality of active portions. The transistors have at least three different threshold voltages.

In yet another embodiment, a method for forming a semiconductor structure is disclosed. The method includes: forming an active layer over a substrate, wherein the active layer comprises a plurality of active portions; forming a polarization modulation layer comprising a plurality of polarization modulation portions each of which is disposed on a corresponding one of the plurality of active portions; and forming a plurality of transistors each of which comprises a source region, a drain region, and a gate structure disposed on a corresponding one of the plurality of polarization modulation portions. The transistors have at least three different threshold voltages.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor structure, comprising:
a substrate;
an active layer that is formed over the substrate and comprises a plurality of active portions;
a polarization modulation layer comprising a plurality of polarization modulation portions each of which is disposed on a corresponding one of the plurality of active portions; and
a plurality of transistors each of which comprises a source region, a drain region, and a gate structure formed on a corresponding one of the plurality of polarization modulation portions, wherein
a threshold voltage of each of the plurality of transistors has a fixed value, and
threshold voltages of the plurality of transistors have in total at least three different fixed values.
2. The semiconductor structure of claim 1, wherein:
the plurality of transistors are high electron mobility transistors to be used in a same multi-stage driver circuit.
3. The semiconductor structure of claim 1, wherein the plurality of transistors comprises:
a first transistor having a first threshold voltage;
a second transistor having a second threshold voltage that is lower than the first threshold voltage; and
a third transistor having a third threshold voltage that is lower than the second threshold voltage.
4. The semiconductor structure of claim 3, wherein:
the first transistor and the second transistor are different in terms of a first manner selected from a group of manners including: different gate materials, different materials of corresponding polarization modulation portions, different thicknesses of corresponding active portions, different material compositions of corresponding active portions, and different structures of corresponding active portions; and
the second transistor and the third transistor are different in terms of a second manner selected from the group of manners, wherein the first manner is different from the second manner.

5. The semiconductor structure of claim 3, wherein:
at least two of the first transistor, the second transistor and the third transistor are different in terms of at least two manners selected from a group of manners including: different gate materials, different materials of corresponding polarization modulation portions, different thicknesses of corresponding active portions, different material compositions of corresponding active portions, and different structures of corresponding active portions.

6. The semiconductor structure of claim 5, wherein:
the different gate materials are metal materials with different work functions;
the different materials of corresponding polarization modulation portions are gallium nitride (GaN) doped by different p-type doping material selected from column I and column II elements;
the different material compositions of corresponding active portions are aluminum gallium nitride (AlGaN) with different Al proportions; and
the different structures of corresponding active portions comprise: (a) a graded structure that includes a plurality of sub-layers each of which comprises AlGaN with a different Al proportion and (b) a homogeneous structure that comprises AlGaN with a single constant Al proportion.

7. The semiconductor structure of claim 1, further comprising a channel layer formed over the substrate and below the active layer, wherein:
the channel layer comprises a first III-V semiconductor material; and
the active layer comprises a second III-V semiconductor material that is different from the first III-V semiconductor material.

8. The semiconductor structure of claim 7, wherein:
the first III-V semiconductor material comprises gallium nitride (GaN); and
the second III-V semiconductor material comprises aluminum gallium nitride (AlGaN).

9. A circuit, comprising:
a plurality of transistors each of which comprises: a source, a drain, a gate and a polarization modulation portion under the gate, wherein:
the plurality of transistors are formed on a same semiconductor wafer including an active layer that comprises a plurality of active portions,
the polarization modulation portion of each of the plurality of transistors is disposed on a corresponding one of the plurality of active portions,
a threshold voltage of each of the plurality of transistors has a fixed value, and
threshold voltages of the plurality of transistors have in total at least three different fixed values.

10. The circuit of claim 9, wherein the plurality of transistors comprises:
a first transistor having a first threshold voltage;
a second transistor having a second threshold voltage that is lower than the first threshold voltage; and
a third transistor having a third threshold voltage that is lower than the second threshold voltage.

11. The circuit of claim 10, wherein:
the first transistor and the second transistor are different in terms of a first manner selected from a group of manners including: different gate materials, different materials of corresponding polarization modulation portions, different thicknesses of corresponding active portions, different material compositions of corresponding active portions, and different structures of corresponding active portions; and
the second transistor and the third transistor are different in terms of a second manner selected from the group of manners, wherein the first manner is different from the second manner.

12. The circuit of claim 10, wherein:
at least two of the first transistor, the second transistor and the third transistor are different in terms of at least two manners selected from a group of manners including: different gate materials, different materials of corresponding polarization modulation portions, different thicknesses of corresponding active portions, different material compositions of corresponding active portions, and different structures of corresponding active portions.

13. The circuit of claim 10, wherein:
at least one of a first source and a first drain of the first transistor is electrically connected to a ground voltage; and
at least one of a third source and a third drain of the third transistor is electrically connected to a positive supply voltage.

14. The circuit of claim 13, wherein:
at least one of the first source and the first drain is electrically connected to an output pin of the circuit.

15. The circuit of claim 13, wherein a first gate of the first transistor is physically coupled to the third source.

16. The circuit of claim 13, wherein a second drain of the second transistor is physically coupled to the third source.

17. The circuit of claim 10, wherein:
the first transistor is at least one of:
a high voltage enhancement-mode high electron mobility transistor (HV E-HEMT),
a low voltage enhancement-mode high electron mobility transistor (LV E-HEMT), and
a low voltage depletion-mode high electron mobility transistor (LV D-HEMT);
and
each of the second transistor and the third transistor is an LV E-HEMT.

18. A method for forming a semiconductor structure, comprising:
forming an active layer over a substrate, wherein the active layer comprises a plurality of active portions;
forming a polarization modulation layer comprising a plurality of polarization modulation portions each of which is disposed on a corresponding one of the plurality of active portions; and
forming a plurality of transistors each of which comprises a source region, a drain region, and a gate structure disposed on a corresponding one of the plurality of polarization modulation portions, wherein
a threshold voltage of each of the plurality of transistors has a fixed value, and
threshold voltages of the plurality of transistors have in total at least three different fixed values.

19. The method of claim 18, wherein:
the plurality of transistors are high electron mobility transistors to be used in a same multi-stage driver circuit;
the plurality of transistors comprises:
a first transistor having a first threshold voltage,
a second transistor having a second threshold voltage that is lower than the first threshold voltage, and
a third transistor having a third threshold voltage that is lower than the second threshold voltage.

20. The method of claim 19, wherein:

the first transistor and the second transistor are different in terms of a first manner selected from a group of manners including: different gate materials, different materials of corresponding polarization modulation portions, different thicknesses of corresponding active portions, different material compositions of corresponding active portions, and different structures of corresponding active portions; and the second transistor and the third transistor are different in terms of a second manner selected from the group of manners, wherein the first manner is different from the second manner.

* * * * *